United States Patent
Imanishi et al.

(10) Patent No.: US 11,856,704 B2
(45) Date of Patent: Dec. 26, 2023

(54) TAPE AUTO-LOADING DEVICE AND TAPE LINKING METHOD THEREFOR

(71) Applicant: FUJI CORPORATION, Chiryu (JP)

(72) Inventors: Satoshi Imanishi, Okazaki (JP); Kazushi Nonoyama, Toyota (JP); Daisuke Suzuki, Chiryu (JP); Masami Kawabata, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 786 days.

(21) Appl. No.: 16/977,196

(22) PCT Filed: Mar. 21, 2018

(86) PCT No.: PCT/JP2018/011238
§ 371 (c)(1),
(2) Date: Sep. 1, 2020

(87) PCT Pub. No.: WO2019/180858
PCT Pub. Date: Sep. 26, 2019

(65) Prior Publication Data
US 2021/0007252 A1    Jan. 7, 2021

(51) Int. Cl.
*H05K 13/02* (2006.01)
*B65H 19/10* (2006.01)

(52) U.S. Cl.
CPC ......... *H05K 13/021* (2013.01); *B65H 19/102* (2013.01); *H05K 13/0215* (2018.08)

(58) Field of Classification Search
CPC . H05K 13/021; H05K 13/0215; B65H 19/102
See application file for complete search history.

(56) References Cited

U.S. PATENT DOCUMENTS

| | | |
|---|---|---|
| 5,863,381 A | 1/1999 | Magota et al. |
| 2010/0206458 A1 | 8/2010 | Yamada et al. |

FOREIGN PATENT DOCUMENTS

| | | | |
|---|---|---|---|
| JP | 8-113213 A | | 5/1996 |
| JP | 11-87991 A | | 3/1999 |
| WO | WO 2009/044560 A1 | | 4/2009 |
| WO | WO-2013/186848 A1 | * | 12/2013 |

(Continued)

OTHER PUBLICATIONS

International Search Report dated Jun. 5, 2018 in PCT/JP2018/011238 filed Mar. 21, 2018, 2 pages.

*Primary Examiner* — Jeffry H Aftergut
(74) *Attorney, Agent, or Firm* — Oblon, McClelland, Maier & Neustadt, L.L.P.

(57) ABSTRACT

A tape auto-loading device for loading a carrier tape including a cover tape gripping device configured to grip a distal end of the cover tape which is peeled off from the base tape, a linking device configured to link the temporary tape held by the temporary tape laying device to a distal end portion of the cover tape gripped by the cover tape gripping device, and a transfer device configured to transfer the temporary tape linked to the distal end portion of the cover tape from the temporary tape laying device to the tape feeder. The linking device includes a tape support member and a heating member each having respective shapes for pinching the predetermined portion in such a state of the predetermined portion being bent at a halfway position along a length in a tape's longitudinal direction.

5 Claims, 13 Drawing Sheets

(56) References Cited

FOREIGN PATENT DOCUMENTS

| WO | WO 2013/186848 A1 | 12/2013 |
| WO | WO-02014/097473 A1 * | 6/2014 |
| WO | WO 2014/097473 A1 | 6/2014 |

* cited by examiner

TAPE AUTO-LOADING DEVICE AND TAPE LINKING METHOD THEREFOR

TECHNICAL FIELD

The present description relates to a tape auto-loading device and a tape linking method therefor.

BACKGROUND ART

Conventionally, there has been known a tape auto-loading device for loading a carrier tape, in which a cover tape is affixed to a base tape, into a tape feeder (for example, refer to Patent Literature 1). The carrier tape has the base tape, on which accommodation sections where to accommodate components are provided, and the cover tape which closes the accommodation sections. The cover tape is affixed to the base tape in such a manner as to be peeled off therefrom so that the components accommodated in the accommodation sections can be removed. The carrier tape is wound around a tape reel that can be mounted in the tape feeder. In the tape feeder, the carrier tape is pulled out from the tape reel so mounted, and the cover tape is peeled off from the base tape of the carrier tape so that the components in the accommodation sections can be sucked at a component suction position. In addition, in the tape feeder, the cover tape, which is peeled off from the base tape, is fed out along a predetermined path to an exterior of the tape feeder.

The tape auto-loading device includes a temporary tape laying device, a cover tape gripping device, a linking device, and a transfer device. The temporary tape laying device is a device for laying a temporary tape along a path following the predetermined path of the tape feeder and holding it in position. The temporary tape is an extension tape which is provided separately from the cover tape which is peeled off from the base tape to be linked to a distal end portion of the cover tape so as to lay the cover tape along the predetermined path. The cover tape gripping device is a device for gripping a distal end of the cover tape peeled off from the base tape. The linking device has a heating member. The linking device links the temporary tape to a distal end side of the cover tape with an adhesive remaining on a peeled-off surface of the cover tape by applying a heating process to the distal end side of the cover tape gripped by the cover tape gripping device and the temporary tape held by the temporary tape laying device using the heating member in such a state the distal end side of the cover tape and the temporary tape are disposed to overlap each other between a tape retaining member and the heating member. Then, the transfer device transfers the temporary tape bonded to the distal end side of the cover tape from the temporary tape laying device to the tape feeder.

PATENT LITERATURE

Patent Literature 1: WO 2013/186848

BRIEF SUMMARY

Technical Problem

When the cover tape and the temporary tape are bonded together as described above, non-adhesive sections are provided at respective distal end sides of the cover tape and the temporary tape, the non-adhesive sections extending from an end portion of the bonding portion in a tape's longitudinal direction. On the other hand, in the case that portions of the heating member of the linking device and the tape retaining member which hold the cover tape and the temporary tape together therebetween constitute flat surfaces, the bonding portion where the cover tape and the temporary tape are bonded together constitutes a flat surface. In this case, in the event that the direction in which the non-adhesive section at the distal end side of the cover tape or the temporary tape extends from the end portion of the bonding portion in the tape's longitudinal direction is fixed to form a certain angle with respect to a direction in which the temporary tape or the cover tape extends from the end portion in question, the following states are generated.

Specifically speaking, the non-adhesive section at the distal end side of one or a first tape of the cover tape and the temporary tape is overlapped with the other or a second tape thereof from above to thereby be put in a state in which an upper portion of the non-adhesive section is pressed down by the second tape when the temporary tape bonded to the distal end side of the cover tape is transferred from the temporary tape laying device to the tape feeder, whereby the non-adhesive section is prevented from rising to move upwards. On the other hand, the non-adhesive section at the distal end side of the second tape of the cover tape and the temporary tape is not put in a state in which an upper portion thereof is pressed down by the first tape from above when the temporary tape bonded to the distal end side of the cover tape is transferred from the temporary tape laying device to the tape feeder, whereby the non-adhesive section is caused to separate to move upwards by an amount corresponding the angle. This amount by which the non-adhesive section is caused to separate to move upwards becomes greater as the angle described above becomes greater. In the event that an excessive upward movement of the non-adhesive section is generated, there is caused, for example, a drawback in that a component pickup head comes into contact with the upwardly separated portion, whereby a component held by the component pickup head is caused to fall off therefrom.

An object of the present description is to provide a tape auto-loading device and a tape linking method therefor which can prevent a distal end side of a cover tape or a temporary tape from rising to move upwards after the tapes are linked together.

Solution to Problem

The present description discloses a tape auto-loading device for loading a carrier tape in a tape feeder in which a cover tape is peeled off from a base tape of the carrier tape and the cover tape so peeled off is discharged therefrom along a predetermined path, the tape auto-loading device including a temporary tape laying device configured to lay a temporary tape along a path following the predetermined path and hold the temporary tape in position, a cover tape gripping device configured to grip a distal end of the cover tape which is peeled off from the base tape, a linking device configured to link the temporary tape held by the temporary tape laying device to a distal end portion of the cover tape gripped by the cover tape gripping device, and a transfer device configured to transfer the temporary tape linked to the distal end portion of the cover tape from the temporary tape laying device to the tape feeder, wherein the linking device has a tape support member configured to support the distal end portion of the cover tape and the temporary tape in such a state that the distal end portion of the cover tape and the temporary tape overlap each other and a heating member configured to heat-bond the cover tape and the temporary tape together by pinching a predetermined portion where the distal end portion of the cover tape and the temporary tape overlap each other, the heat-bonding being performed between the tape support member and the heating member; and wherein the tape support member and the heating member have respective shapes for pinching the predetermined portion in such a state of the predetermined portion being bent at a halfway position along a length in a tape's longitudinal direction.

In addition, the present description discloses a tape linking method for a tape auto-loading device for loading a carrier tape in a tape feeder in which a cover tape is peeled off from a base tape of the carrier tape and the cover tape so peeled off is discharged therefrom along a predetermined path, the tape linking method being configured to link a temporary tape laid along a path following the predetermined path and held in position by a temporary tape laying device to a distal end side of the cover tape gripped by a cover tape gripping device, wherein the cover tape and the temporary tape are heat-bonded together by pinching a predetermined portion where the distal end portion of the cover tape and the temporary tape overlap each other between a tape support member and a heating member in such a state that the predetermined portion is bent at a halfway position along a length thereof in a tape's longitudinal direction.

According to the present disclosure, both the tape support member and the heating member hold the predetermined portion where the cover tape and the temporary tape overlap each other in such a state that the predetermined portion is bent in the halfway position along the length thereof in the tape's longitudinal direction. As a result, the predetermined portion where the tapes overlap each other is formed in such a state that the predetermined portion is bent in the halfway position thereof in the tape's longitudinal direction when the cover tape and the temporary tape are heat-bonded together. When the cover tape or the temporary tape is pulled after the predetermined portion is so formed, a tension resulting from the pull on the tape is applied to the whole of the predetermined portion, whereby the predetermined portion is stretched into a straight line-like shape over a whole area in the tape's longitudinal direction in such a manner as to eliminate the fold. In this case, the second tape is also stretched into a straight line-like shape over a whole area in the tape's longitudinal direction in such a manner as to eliminate the fold as the first tape is so stretched. This enables a portion of the second tape lying closer to the distal end side than the fold to be lowered, whereby the distal end side of the second tape can be prevented from rising to move upwards.

DESCRIPTION OF EMBODIMENTS

Figure 1:
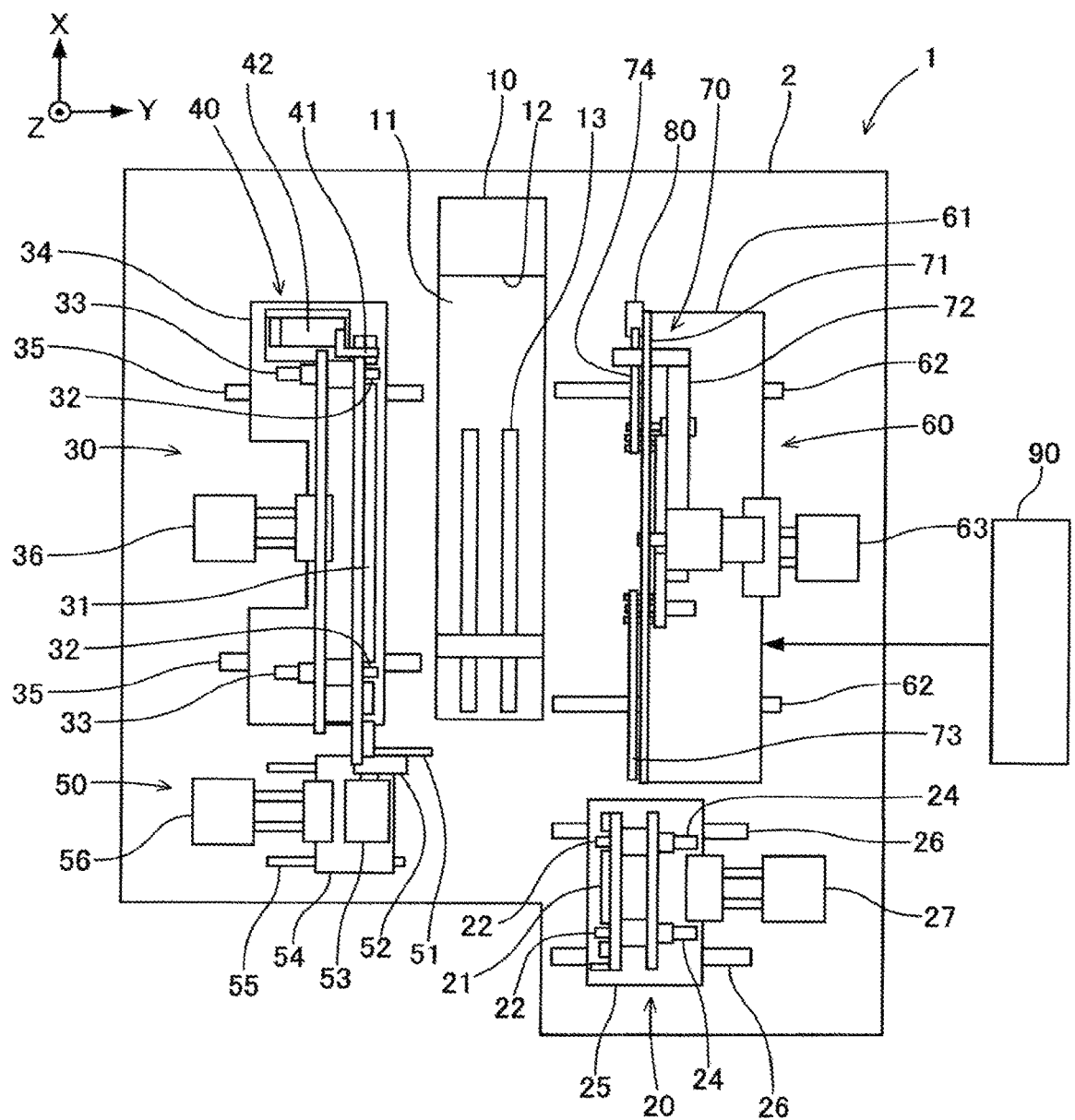
FIG. 1 is a schematic top view of a tape auto-loading device according to one embodiment of the present disclosure.

Tape auto-loading device 1 according to an embodiment of the present disclosure will be described by use of drawings. Tape auto-loading device 1 is a device for automatically loading carrier tape 200 into tape feeder 100. Tape auto-loading device 1 includes, as shown in FIG. 1, feeder holding stand 10, first tape conveyance device 20, second tape conveyance device 30, first release device 40, second release device 50, and cover tape processing device 60.

Figure 2:
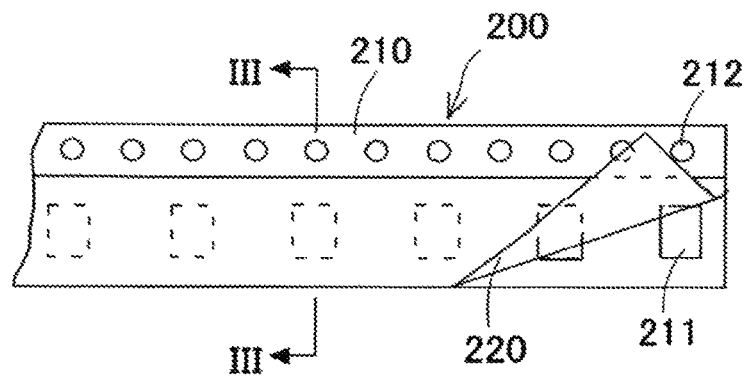
FIG. 2 is a top view of a carrier tape.
Figure 3:
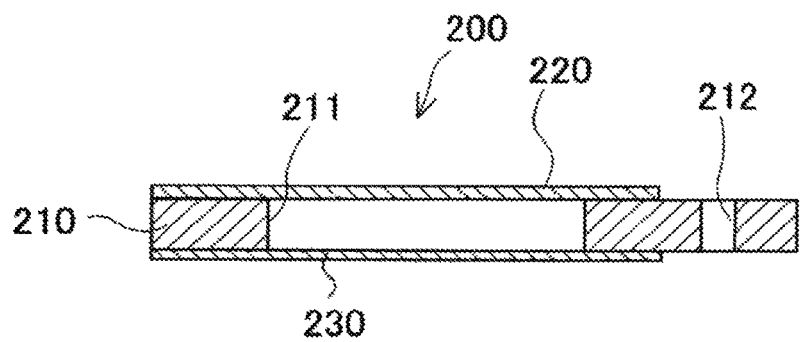
FIG. 3 is a sectional view of a carrier tape taken along a line III-Ill shown in FIG. 2.

Firstly, the configuration of carrier tape 200 will be described by use of FIGS. 2 and 3. Carrier tape 200 is a tape member which accommodates multiple components in a single row in a longitudinal direction. As shown in FIGS. 2 and 3, carrier tape 200 has base tape 210 and cover tape 220. Base tape 210 is made of a soft and flexible material such as a paper material, a resin, or the like. Accommodation holes 211 are provided in base tape 210. Accommodation holes 211 are accommodation sections which can accommodate components. Accommodation holes 211 are provided at predetermined intervals in a longitudinal direction of base tape 210. Components are electronic components to be mounted on a board and may be micro components of a 0201 size (0.2 mm×0.1 mm), for example.

Carrier tape 200 may be such that accommodation holes 211 penetrate base tape 210 or may be of an embossed type in which accommodation holes 211 are depressed into base tape 210 without penetrating base tape 210. Additionally, when carrier tape 200 has a structure in which accommodation hole 211 penetrates base tape 210 as shown in FIG. 3, in order to hold a component accommodated in accommodation hole 211 so as to prevent the component from falling off from accommodation hole 211, carrier tape 200 further has bottom tape 230 which is bonded to a lower face of base tape 210. This bottom tape 230 is made of a transparent or translucent paper material or polymer film.

Engagement holes 212 are provided in base tape 210 in such a manner as to penetrate base tape 210. Engagement holes 212 are feed holes with which engagement protrusions of a sprocket, which will be described later, are brought into engagement. Engagement holes 212 are each formed into a substantially circular or elliptical shape. Engagement holes 212 have a size enabling the engagement protrusions of the sprocket, which will be described later, to be brought into engagement therewith. Engagement holes 212 are provided at predetermined intervals in the longitudinal direction of base tape 210. Accommodation holes 211 described above are disposed into a single row in the longitudinal direction of base tape 210 on a first side of base tape 210 in a width direction thereof. Further, engagement holes 212 described above is disposed into a single row in the longitudinal direction of base tape 210 on a second side of base tape 210 in the width direction thereof.

Cover tape 220 is bonded to an upper face (a portion where engagement holes 212 are provided may be excluded) of base tape 210 with an adhesive. Bonding of cover tape 220 to base tape 210 is executed at both sides of carrier tape 200 in the width direction by avoiding transverse positions of accommodation holes 211. Cover tape 220 has a function to close portions of base tape 210 which lie above accommodation holes 211 so as to prevent components accommodated in accommodation holes 211 from coming out of corresponding accommodation holes 211. Cover tape 220 is made of a transparent polymer film or the like.

Next, referring to FIGS. 4 to 6, the configuration of tape feeder 100 will be described. Tape feeder 100 is a device for supplying a component to be mounted on a board to component suction position L by conveying carrier tape 200. Tape feeder 100 is detachably mounted in a slot of a component mounter which is provided on a board production line for producing boards. A component supplied from tape feeder 100 to component suction position L is picked up and held by a suction nozzle or the like which is attached to a mounting head of the component mounter, whereafter the component is mounted on a board as a result of a suction release.

Figure 4:
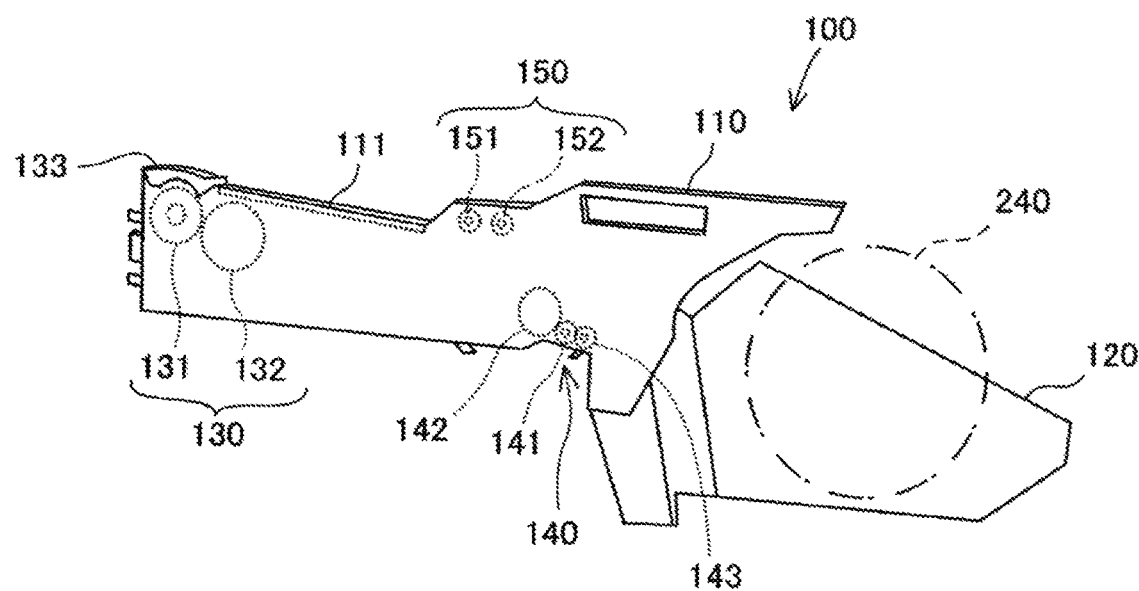
FIG. 4 is a schematic perspective view of a tape feeder for conveying the carrier tape.

As shown in FIG. 4, tape feeder 100 has feeder main body 110, reel accommodation section 120, and tape feeding mechanism 130. Feeder main body 110 has a flat box shape. Feeder main body 110 has tape feed guide 111. Tape feed guide 111 is provided on an upper portion of feeder main body 110. Reel accommodation section 120 is disposed at a rear end side of feeder main body 110. Reel accommodation section 120 is a portion for accommodating a circular disk-shaped tape reel 240 around which carrier tape 200 is wound. Carrier tape 200 is pulled out from tape reel 240 accommodated in reel accommodation section 120 and is guided by tape feed guide 111. Tape feed guide 111 defines a tape path for guiding carrier tape 200 between reel accommodation section 120 and tape feeding mechanism section 130.

Tape feeding mechanism section 130 is disposed at a front end side of feeder main body 110. Tape feeding mechanism section 130 is a mechanism section for pitch feeding carrier tape 200 pulled out from tape reel 240. Tape feeding mechanism section 130 has sprocket 131, motor 132, and first tape holding section 133. Tape feeding mechanism section 130 may be disposed not only at the front end side but also at a rear end side of feeder main body 110.

Sprocket 131 is a circular disk-shaped member provided underneath a tape conveyance path in feeder main body 110. Sprocket 131 is rotatably attached to the front end side of feeder main body 110. Sprocket 131 rotates in a direction in which carrier tape 200, which is guided by tape feed guide 111, is conveyed. Sprocket 131 has engagement protrusions constituting external teeth protruding radially outwards on an outer peripheral surface thereof. These engagement protrusions are provided at predetermined angular intervals along a full circumference of the outer peripheral surface of sprocket 131.

Motor 132 is coupled to sprocket 131 via a gear. Motor 132 is a servomotor for rotating sprocket 131. When motor 132 is driven to rotate, its rotation is transmitted to sprocket 131 while being decelerated using the gear, whereby sprocket 131 is rotated. Motor 132 is driven in such a manner that sprocket 131 rotates intermittently. As sprocket 131 rotates, since engagement protrusions thereon are brought into engagement with engagement holes 212 in carrier tape 200, which is being guided by tape feed guide 111, carrier tape 200 is conveyed in conveyance direction X. Carrier tape 200 is conveyed at a predetermined pitch.

First tape holding section 133 constitutes a portion configured to hold carrier tape 200 with engagement holes 212 of which the engagement protrusions of sprocket 131 are brought into engagement. First tape holding section 133 covers an upper face of carrier tape 200 from above. A window hole is provided in an upper face of first tape holding section 133, and an opening hole is also provided therein. Sprocket 131 is disposed in such a manner that the engagement protrusion arriving at the vicinity of an upper end thereof protrudes from the tape conveyance path through the window hole. The engagement protrusion is brought into engagement with engagement hole 212 in carrier tape 200 in such a state that engagement protrusion protrudes from the tape conveyance path. The opening hole is provided in component suction position L.

Figure 5:
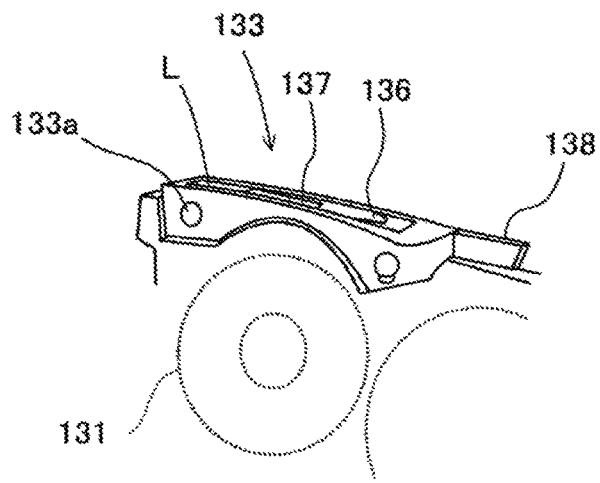
FIG. 5 is an enlarged perspective view of a distal end portion of the tape feeder.
Figure 6:
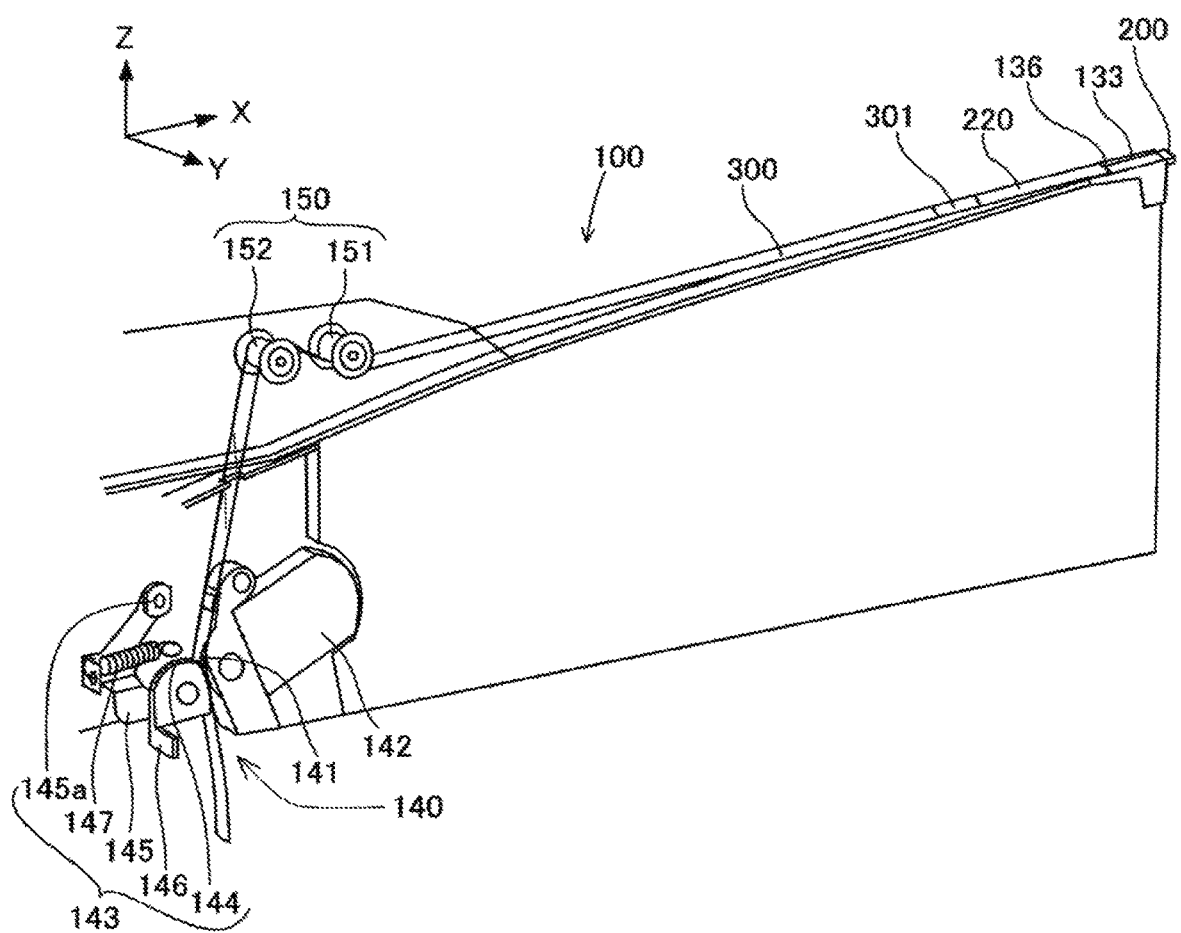
FIG. 6 is a perspective view showing a state in which the carrier tape is loaded in the tape feeder.

As shown in FIG. 5, tape peeling member 136 and tape folding member 137 are provided on the upper face of first tape holding section 133. Tape peeling member 136 is disposed at an upstream side of the opening hole in the conveyance direction. Tape peeling member 136 is a peeling blade for peeling off cover tape 220 from base tape 210 of carrier tape 200. Tape folding member 137 is a member configured to raise a first side in the width direction of cover tape 220 peeled off from base tape 210 (specifically speaking, a side where accommodation holes 211 in carrier tape 200 provided to accommodate components are disposed) so as to fold it back.

Rotation fulcrum 133a is provided in first tape holding section 133. Rotation fulcrum 133a is disposed at a front end portion of first tape holding section 133 so that a rear end side thereof can move upwards. Lever 138, which the operator can operate, is provided at a rear end portion of first tape holding section 133 in such a manner as to protrude therefrom. A biasing member (not shown), which is configured to bias the rear end side of first tape holding section 133 downwards, is assembled to first tape holding section 133 in a position lying between the rear end portion of first tape holding section 133 and feeder main body 110. When lever 138 is not uplifted, first tape holding section 133 holds carrier tape 200 between sprocket 131 and itself, whereas when lever 138 is uplifted against a biasing force of the biasing member, first tape holding section 133 releases the holding of carrier tape 200 executed between sprocket 131 and itself.

Tape feeder 100 also has cover tape feeding mechanism section 140. Cover tape feeding mechanism section 140 is disposed at a central lower portion of feeder main body 110. Cover tape feeding mechanism section 140 is a mechanism section configured to feed out cover tape 220, which is peeled off at tape peeling member 136 and is then bent at tape folding member 137, in an opposite direction to conveyance direction X of carrier tape 200. Cover tape feeding mechanism section 140 has gear 141, motor 142, and second tape holding section 143.

Gear 141 is rotatably mounted at a central lower portion of feeder main body 110. Motor 142 is coupled to gear 141. Motor 142 is a servomotor for rotationally driving gear 141. Second tape holding section 143 is a portion configured to hold cover tape 220, which is being fed out, so that cover tape 220 is not dislocated from feeder main body 110. Second tape holding section 143 has, as shown in FIG. 6, gear 144, arm 145, lever 146, and coil spring 147.

Gear 144 meshes with gear 141 described above. Rotation fulcrum 145a is provided on arm 145. Arm 145 is configured to allow gear 144 to move towards gear 141 about rotation fulcrum 145a. Lever 146 protrudes downwards from arm 145. Coil spring 147 generates a biasing force which acts to bias arm 145 towards gear 141 via lever 146. Second tape holding section 143 causes gear 144 to mesh with gear 141 by means of the biasing force of coil spring 147 to hold cover tape 220 when lever 146 is not moved, whereas when lever 146 is moved against the biasing force of coil spring 147, second tape holding section 143 causes gear 144 to move away from gear 141 to release the holding of cover tape 220.

Tape feeder 100 also has cover tape feed guide 150. Cover tape feed guide 150 is provided between tape peeling member 136 of tape feeder 100 and cover tape feeding mechanism section 140. Cover tape feed guide 150 guides cover tape 220, which is peeled off at tape peeling member 136, to cover tape feeding mechanism section 140. Cover tape feed guide 150 is made up of pair of guide rollers 151, 152. Guide rollers 151, 152 are disposed above carrier tape 200 that is guided on tape feed guide 111. Guide roller 151 disposed at a front end side of tape feeder 100 plays a role of imparting a tension to cover tape 220 in order to prevent cover tape 220 from being loosened.

In being conveyed in conveyance direction X, firstly, carrier tape 200 is pulled out from tape reel 240, is guided by tape feed guide 111, and is held by first tape holding section 133. Then, carrier tape 200 is conveyed in conveyance direction X as a result of rotation of motor 132 while being held by first tape holding section 133. During the conveyance in conveyance direction X, carrier tape 200 is put in a state in which cover tape 220 is peeled off from base tape 210 by tape peeling member 136 entering between base tape 210 and cover tape 220. Cover tape 220, which is peeled off from base tape 210, is laid from first tape holding section 133 to second tape holding section 143 along a path so extending by way of pair of guide rollers 151, 152 (hereinafter, referred to as a discharge path). Then, cover tape 220 so laid out is discharged outwards of feeder main body 110 (specifically speaking, downwards of second tape holding section 143) as a result of rotation of motor 142 which is synchronized with the rotation of motor 132 described above while being held by second tape holding section 143.

Figure 7:
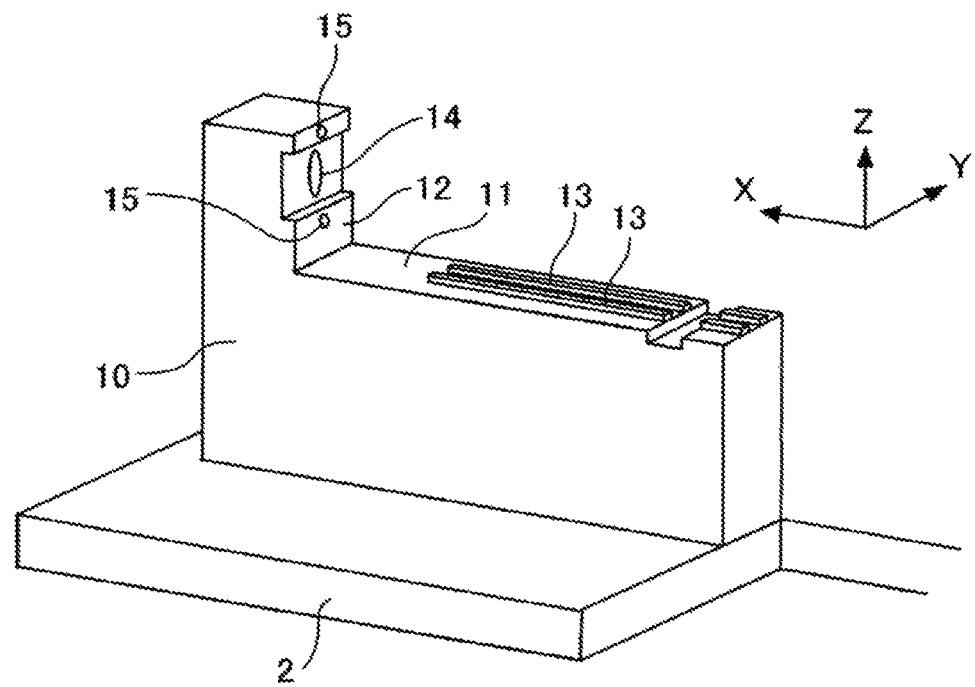
FIG. 7 is a schematic perspective view of a feeder holding stand that the tape auto-loading device includes.

Next, the configuration of tape auto-loading device 1 will be described using FIGS. 7 to 15. In tape auto-loading device 1, feeder holding stand 10 constitutes a seat for holding tape feeder 100. As shown in FIG. 7, feeder holding stand 10 is disposed at a central portion of base plate 2 of tape auto-loading device 1. Feeder holding stand 10 has placement section 11 and abutting section 12. A bottom face of feeder main body 110 of tape feeder 100 is placed on placement section 11. A front end face of feeder main body 110 is brought into abutment with abutting section 12. Pair of support guides 13 are provided on placement section 11 so as to support lower portions of both side faces of feeder main body 110. Communication jack 14, which can communicate with and supply power to tape feeder 100, and positioning section 15, which is configured to position tape feeder 100, are provided at abutting section 12.

First tape conveyance device 20 and second tape conveyance device 30 are both a device for conveying carrier tape 200 in conveyance direction X. First tape conveyance device 20 and second tape conveyance device 30 are disposed to face obliquely each other across tape feeder 100 held to feeder holding stand 10 on base plate 2. First tape conveyance device 20 and second tape conveyance device 30 can both reciprocate on base plate 2 in directions in which the first and second tape conveyance devices hold tape feeder 100 held on feeder holding stand 10 from both sides thereof.

Figure 8:
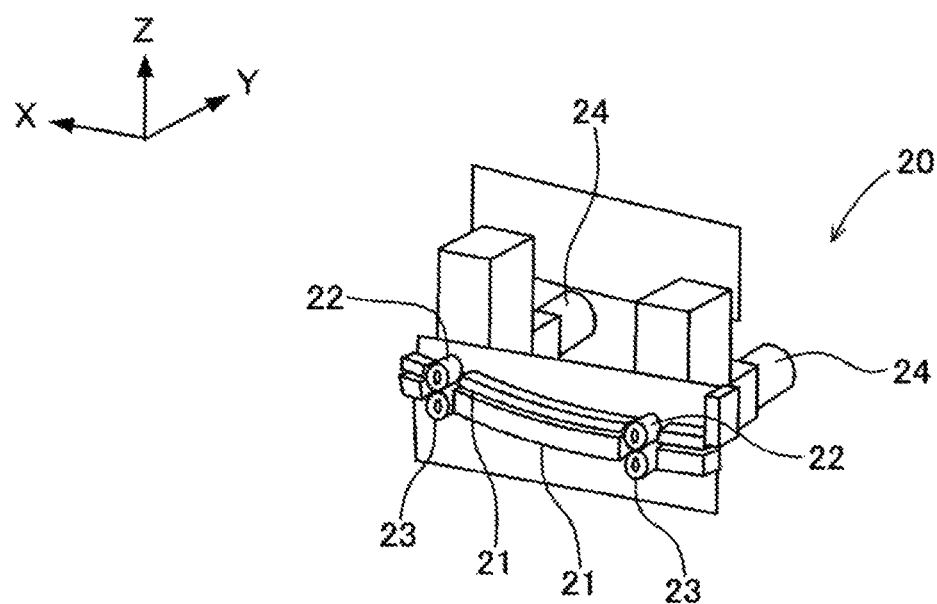
FIG. 8 is a schematic perspective view of a first tape conveyance device that the tape auto-loading device includes.

As shown in FIG. 8, first tape conveyance device 20 has guides 21, two driving rollers 22, two driven rollers 23, and two gear motors 24. Guides 21 guide carrier tape 200 conveyed in conveyance direction X. Two driving rollers 22 are disposed apart from each other in conveyance direction X. Two driven rollers 23 are both disposed below corresponding driving rollers 22 and are biased towards corresponding driving rollers 22 by a biasing member (not shown). Two gear motors 24 each drive to rotate corresponding driving rollers 22. Guides 21 are disposed as a pair of vertically arranged guides at the rear of rear end-side rollers 22, 23, between two pairs of rollers 22, 23, and at the front of front end-side rollers 22, 23.

First tape conveyance device 20 is placed on and fixed to seat 25. Seat 25 is attached to pair of rails 26 in such a manner as to slide in horizontal direction (hereinafter, referred to as an orthogonal direction) Y that extends orthogonal to conveyance direction X. Pair of rails 26 are provided spaced apart from each other at a predetermined interval on base plate 2 in such a manner that both rails 26 extend in the orthogonal direction Y. Seat 25 is connected to air cylinder 27 fixed to base plate 2. Air cylinder 27 is connected to an external air supply source (not shown). Seat 25 can slide in orthogonal direction Y along pair of rails 26 on base plate 2 using air supplied from air cylinder 27.

Figure 9:
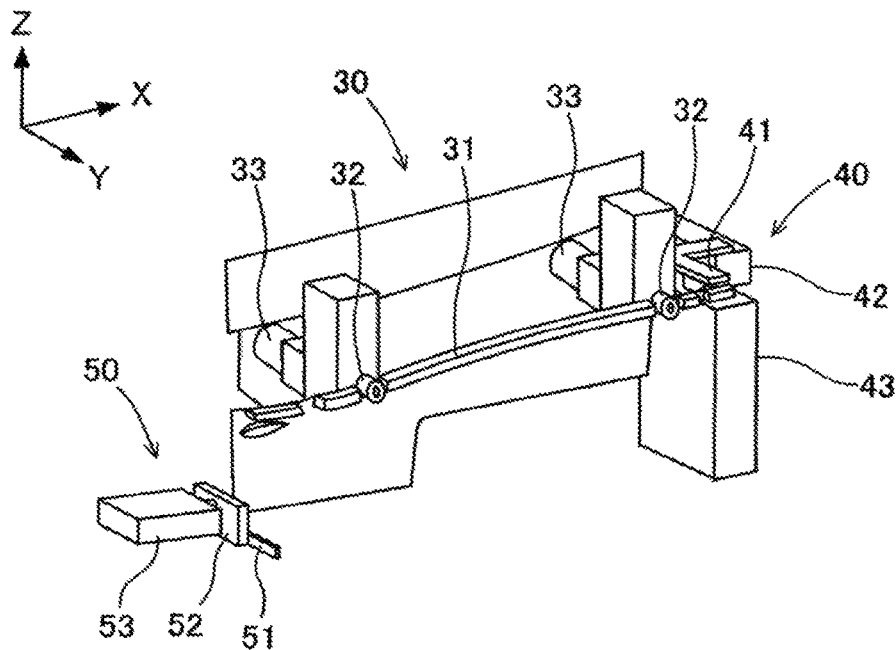
FIG. 9 is a schematic perspective view of a second tape conveyance device, a first release device, and a second release device that the tape auto-loading device includes.

As shown in FIG. 9, second tape conveyance device 30 has guide 31, two driving rollers 32, and two gear motors 33. Guide 31 guides carrier tape 200 conveyed in conveyance direction X. Two driving rollers 32 are disposed spaced apart from each other in conveyance direction X. Two gear motors 33 both drive to rotate corresponding driving rollers 32. Guide 31 is disposed at the rear of rear end-side driving roller 32, between two driving rollers 32, and at the front of front end-side driving roller 32.

Second tape conveyance device 30 is placed on and fixed to seat 34. Seat 34 is attached onto pair of rails 35 in such a manner as to slide in orthogonal direction Y which extends orthogonal to conveyance direction X. Pair of rails 35 are provided spaced apart from each other at a predetermined interval on base plate 2 in such a manner that pair of rails 35 both extend in orthogonal direction Y. Seat 34 is connected to air cylinder 36 fixed to base plate 2. Air cylinder 36 is connected to an external air supply source (not shown). Seat 34 can slide in orthogonal direction Y along pair of rails 35 on base plate 2 using air supplied from air cylinder 36.

As described above, when first and second tape conveyance devices 20, 30 are slid in orthogonal direction Y in such a state that tape 100 is held to feeder holding stand 10 and first and second tape conveyance devices 20, 30 stay near to tape feeder 100, carrier tape 200 conveyed by tape feeder 100 passes through a gap between pair of upper and lower guides 21 of first tape conveyance device 20 to be guided and passes through a gap between guide 31 of second tape conveyance device 30 and tape feed guide 111 of tape feeder 100 to be guided.

First release device 40 and second release device 50 are each a device configured to cancel and release holding of carrier tape 200 by first tape holding section 133 of tape feeder 100 or holding of cover tape 220 by second tape holding section 143. First release device 40 and second release device 50 are both disposed on a side of base plate 2 where second tape conveyance device 30 is disposed rather than a position where tape feeder 100 held on feeder holding stand 10 is disposed.

First release device 40 has first lift lever 41, support table 42, and air cylinder 43. First lift lever 41 is brought into abutment with lever 138 of first tape holding section 133 to thereby move lever 138 in up-down direction Z. Support table 42 supports first lift lever 41 in such a manner that a distal end of first lift lever 41 protrudes towards tape feeder 100. Air cylinder 43 is fixed to seat 34 of second tape conveyance device 30. Air cylinder 43 can move support table 42 in up-down direction Z using air supplied from an air supply source.

Second release device 50 has second lift lever 51, support table 52, and air cylinder 53. Second lift lever 51 is brought into abutment with lever 146 of second tape holding section 143 to thereby move lever 146 in conveyance direction X. Support table 52 supports second lift lever 51 in such a manner that a distal end of second lift lever 51 protrudes towards tape feeder 100. Air cylinder 53 is fixed onto seat 54. Air cylinder 53 can move support table 52 in conveyance direction X.

Seat 54 is attached onto pair of rails 55 in such a manner as to slide in orthogonal direction Y. Pair of rails 55 are provided spaced apart at a predetermined interval on base plate 2 in such a manner as to extend in orthogonal direction Y. Seat 54 is connected to air cylinder 56 fixed to base plate 2. Air cylinder 56 can enable seat 54 to slide along pair of rails 55 in orthogonal direction Y and can also enable support table 52 to move in orthogonal direction Y on base plate 2 using air from an air supply source.

Figure 10:
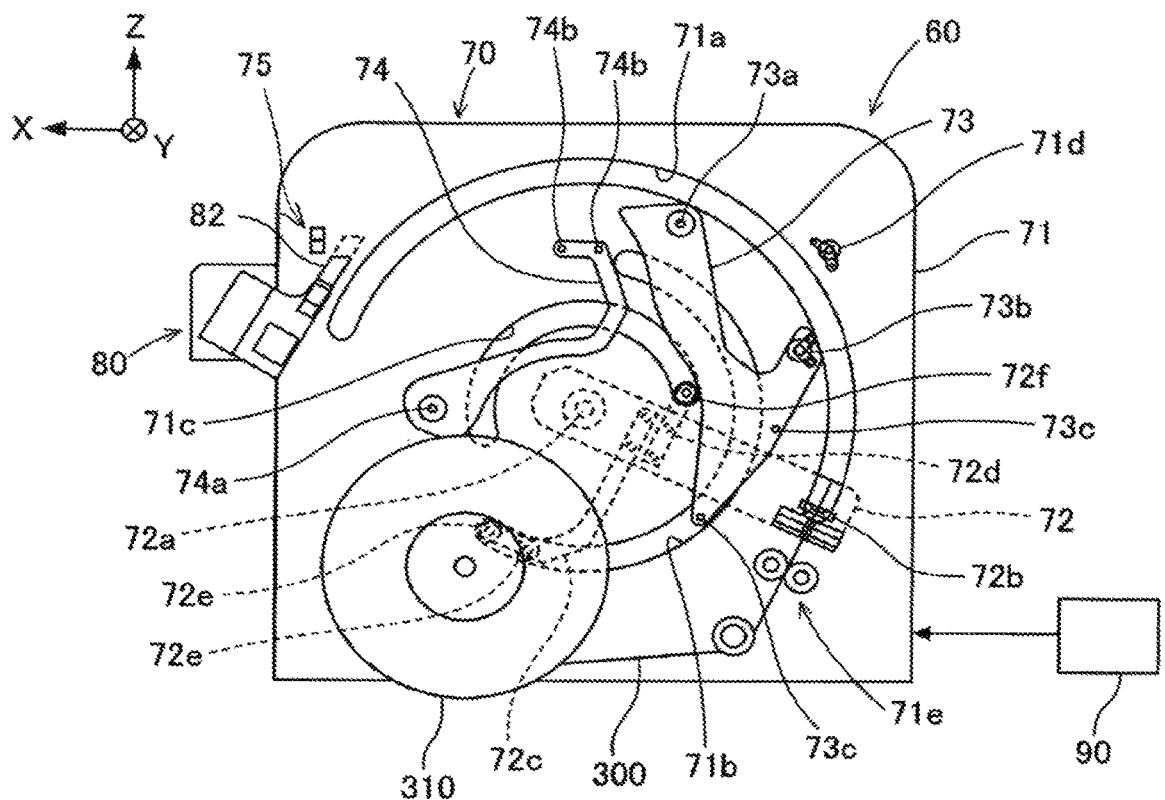
FIG. 10 is a schematic plan view of a cover tape processing device that the tape auto-loading device includes.
Figure 11:
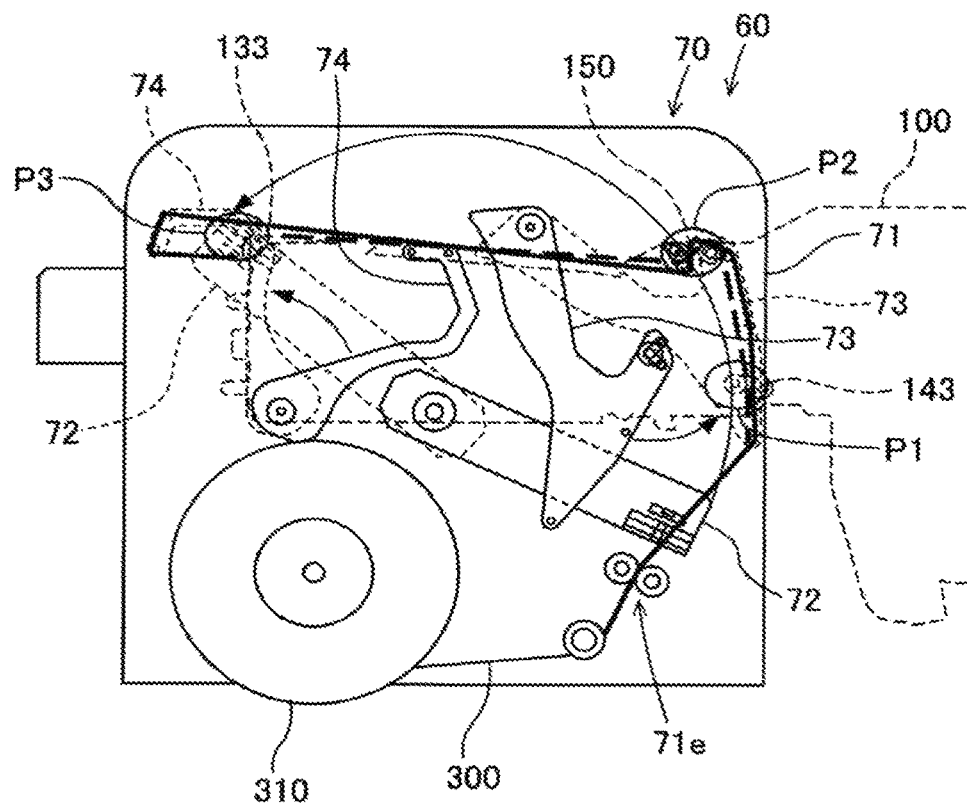
FIG. 11 is a plan view showing a positional relationship between the cover tape processing device and the tape feeder.

Cover tape processing device 60 is a device for discharging cover tape 220 peeled off from base tape 210 of carrier tape 200 to an outside of feeder main body 110 by transferring a temporary tape, which will be described later, to tape feeder 100 held to feeder holding stand 10 and in which cover tape 220 is peeled off from base tape 210 of carrier tape 200. Cover tape processing device 60 is disposed on a side of base table 2 where cover tape feeding mechanism section 140 of tape feeder 100 held to feeder holding stand 10 is exposed, that is, a side where first tape conveyance device 20 is disposed rather than the position where tape feeder 100 is disposed. Cover tape processing device 60 has, as shown in FIG. 10, temporary tape laying device 70, cover tape gripping device 75, linking device 80, and transfer device 90.

Temporary tape laying device 70 is a device for laying temporary tape 300 along a path following a discharge path of cover tape 220 and holding it in place. This path is indicated by a solid line in FIG. 11. Temporary tape 300 is a tape different from carrier tape 200 wound around tape reel 240 and is transferred to tape feeder 100 after having been linked with cover tape 220 which is peeled off from base tape 210 of carrier tape 200. Temporary tape 300 has the same shape and is formed of the same material as those of cover tape 220 of carrier tape 200. Temporary tape 300 is wound around temporary tape reel 310 that can be mounted in temporary tape laying device 70.

Temporary tape laying device 70 is placed on and fixed to seat 61. Seat 61 is attached to pair of rails 62 in such a manner as to slide thereon in orthogonal direction Y. Pair of rails 62 are provided spaced apart from each other at a predetermined interval on base plate 2 in such a manner as for both to extend in orthogonal direction Y. Seat 61 is connected to air cylinder 63 fixed onto base plate 2. Air cylinder 63 is connected to an external air supply source (not shown). Seat 61 can slide along pair of rails 62 in orthogonal direction Y on base plate 2 using air from air cylinder 63.

Temporary tape laying device 70 has main body plate 71, transfer section 72, first pushing section 73, and second pushing section 74. Main body plate 71 is a flat plate member having a substantially rectangular shape. Three guide holes 71a, 71b, 71c, which each have an annular and arcuate shape, are formed concentrically on main body plate 71. outer support pin mechanism section 71d and pair of temporary tape supporting rollers 71e are attached to main body plate 71. Outer support pin mechanism section 71d comes into contact with temporary tape 300 from an outside thereof to support it in place. Outer support pin mechanism section 71d has supporting plate 71f. Supporting plate 71f can rotate on rotation fulcrum 71g relative to main body plate 71. Pin 71h for supporting temporary tape 300 is attached to a distal end portion of supporting plate 71f in such a manner as to protrude in orthogonal direction Y. Temporary tape supporting rollers 71e guide and support temporary tape 300 which is pulled out from temporary tape reel 310.

Transfer section 72 is disposed on a back side (that is, an opposite side to a side facing feeder holding stand 10) of main body plate 71. Transfer unit 72 is supported rotatably on rotation fulcrum 72a at a center of an arc of guide hole 71a. Gripping claw 72b is provided at a distal end portion of transfer section 72. Gripping claw 72b is supported on an edge portion of guide hole 71a having a largest diameter on main body plate 71. Gripping claw 72b can grip temporary tape 300 on a front face side (that is, the side facing feeder holding stand 10) of main body plate 71.

Arms 72c, 72d are fixed to transfer section 72. Arms 72c, 72d both extend in a circumferential direction from transfer section 72 between rotation fulcrum 72a and gripping claw 72b. Arm 72c is positioned on a lower side relative to transfer section 72. Two contact rollers 72e are supported rotatably at a distal end portion of arm 72c. Contact rollers 72e are both supported on an edge portion of guide hole 71b having an intermediate diameter on main body plate 71.

Contact rollers 72e both protrude towards the front face side of main body plate 71. Arm 72d is positioned on an upper side relative to transfer section 72. Contact roller 72f is supported rotatably at a distal end portion of arm 72d. Contact roller 72f is supported on an edge portion of guide hole 71c having a smallest diameter on main body plate 71. Contact roller 72f protrudes towards the front face side of main body plate 71.

In temporary tape laying device 70, when transfer section 72 is rotated by a driving motor, not shown, a distal end portion of temporary tape 300 gripped by gripping claw 72b is transferred along guide hole 71a. In a process of transfer section 72 rotating from an initial angle to a predetermined transfer completion angle, the distal end portion of temporary tape 300 is transferred to third position P3 corresponding to first tape holding section 133 of tape feeder 100 by way of first position P1 corresponding to second tape holding section 143 of tape feeder 100 and second position P2 corresponding to guide tape feed guide 150 of tape feeder 100.

First pushing section 73 is disposed on the front face side of main body plate 71. First pushing section 73 is supported rotatably on rotation fulcrum 73a. First pushing section 73 is biased in a first circumferential direction (a clockwise direction shown in FIG. 10) about rotation fulcrum 73a by a biasing member and is held in a state in which first pushing section 73 is in contact with contact roller 72f of transfer section 72 in an initial state. Inner support pin mechanism section 73b and two guide pins 73c are attached individually to a front face side of first pushing section 73. Inner support pin mechanism section 73b comes into contact with temporary tape 300 from an inside thereof to support it in position. Inner support pin mechanism section 73b has two supporting plates 73d, 73d. Supporting plates 73d, 73e can rotate individually about rotation fulcrum 73a relative to first pushing section 73. Pins 73f, 73g, which are configured to support temporary tape 300, are attached, respectively, to distal end portions of supporting plates 73d, 73e in such a manner as to protrude in orthogonal direction Y. Pins 73f, 73g can rotate individually about rotation fulcrum 73a.

In addition, pins 73f, 73g are coupled individually to tension spring 73h. An initial interval between pin 73f and pin 73g is maintained to a predetermined interval by an elastic force of tension spring 73h. This predetermined interval is a distance between pins 73f, 73g defined when a relative angle deviation between supporting plates 73d, 73e rotating about rotation fulcrum 73a is, for example, about 90 degrees.

Second pushing section 74 is disposed on the front face side of main body plate 71. Second pushing section 74 is supported rotatably on rotation fulcrum 74a. Second pushing section 74 is biased in the first circumferential direction (the clockwise direction shown in FIG. 10) about rotation fulcrum 74a by an elastic member, not shown, and is held in a state in which second pushing section 74 stays in a predetermined phase without contacting contact rollers 72e, 72f of transfer section 72 in an initial state. Two guide pins 74d are disposed on a front face side of second pushing section 74. Guide pins 74b both come into contact with temporary tape 300 from the inside thereof and support the tape in position.

First pushing section 73 and second pushing section 74 come into contact with contact rollers 72e, 72f, respectively, on back face sections thereof which are both formed into a curved surface when transfer section 72 transfers the distal end portion of temporary tape 300 and then rotate in a second circumferential direction (a counterclockwise direction shown in FIG. 10). As this occurs, inner support pin mechanism section 73b and individual guide pins 73c of first pushing section 73 and individual guide pins 74b of second pushing section 74 move to an outer peripheral side of main body plate 71. That is, first pushing section 73 and second pushing section 74 are interlocked with a rotation of transfer section 72 to push out a part of temporary tape 300 which is pulled in by transfer section 72 executing the transfer of temporary tape 300 to the outer peripheral side of main body plate 71. As a result, first pushing section 73 lays temporary tape 300 along a path following a transfer path of cover tape 220. In addition, second pushing section 74 forms an opposite facing section which oppositely faces a distal end portion of cover tape 220 at a portion of temporary tape 300 which is linked with cover tape 220.

In temporary tape laying device 70, in an initial state of transfer section 72 (that is, a state in which a rotation angle of transfer section 72 about rotation fulcrum 72a is zero), as shown in FIG. 10, first pushing section 73 and second pushing section 74 are individually maintained at their initial angles while gripping claw 72b of transfer section 72 is gripping the distal end portion of temporary tape 300 which protrudes from pair of temporary tape support rollers 71e.

Figure 12:
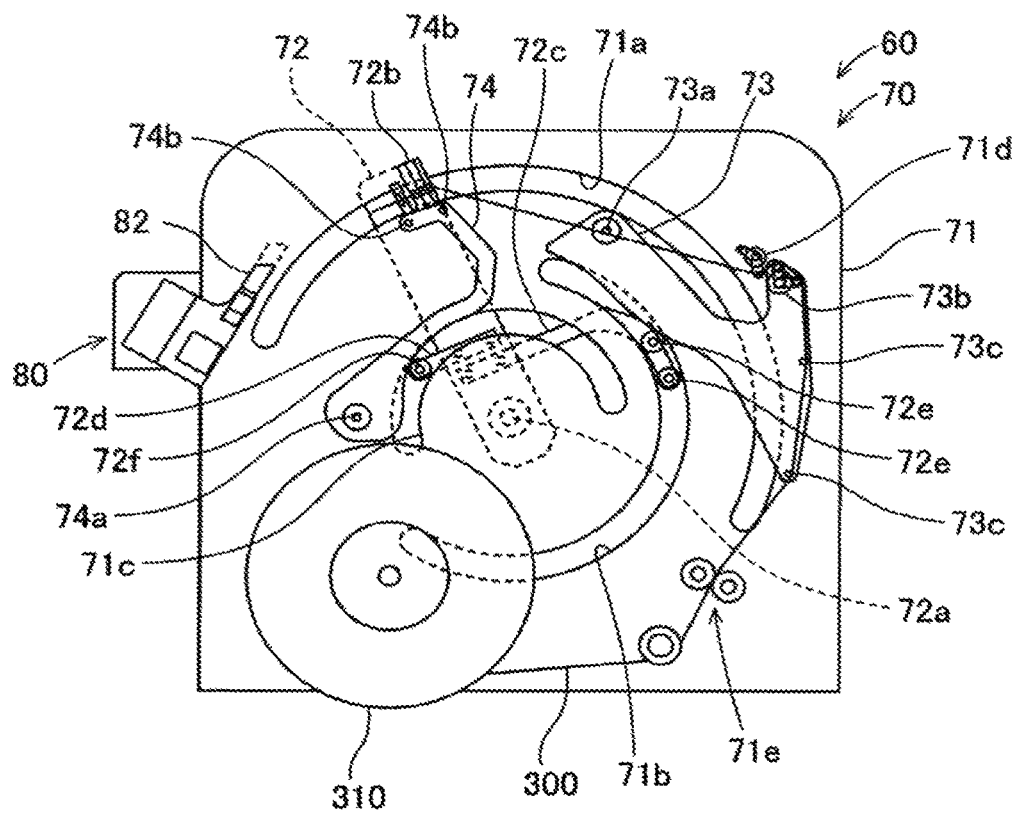
FIG. 12 is a plan view of an initial stage of an operation of a temporary tape laying device 70 that the cover tape processing device has.

Then, when transfer section 72 is driven to rotate from its initial state, temporary tape 300, which is gripped by gripping claw 72b, is subsequently pulled out from temporary tape reel 310 by means of a tension, and the distal end portion of temporary tape 300 is transferred from pair of temporary tape support rollers 71e as a starting point by way of first position P1 and second position P2. Then, when transfer section 72 rotates about 140°, as shown in FIG. 12, contact rollers 72e, 72f come into contact with first pushing section 73 and second pushing section 74, respectively, to thereby cause first pushing section 73 and second pushing section 74 to operate in an interlocked fashion with the movement of transfer section 72. At this time, inner support pin mechanism section 73b and guide pins 73c of first pushing section 73 push gradually temporary tape 300 to the outer peripheral side of main body plate 71. Second pushing section 74 is caused to operate in the interlocked fashion by contact roller 72f but remains in a non-contact state with temporary tape 300 in this state.

Figure 13:
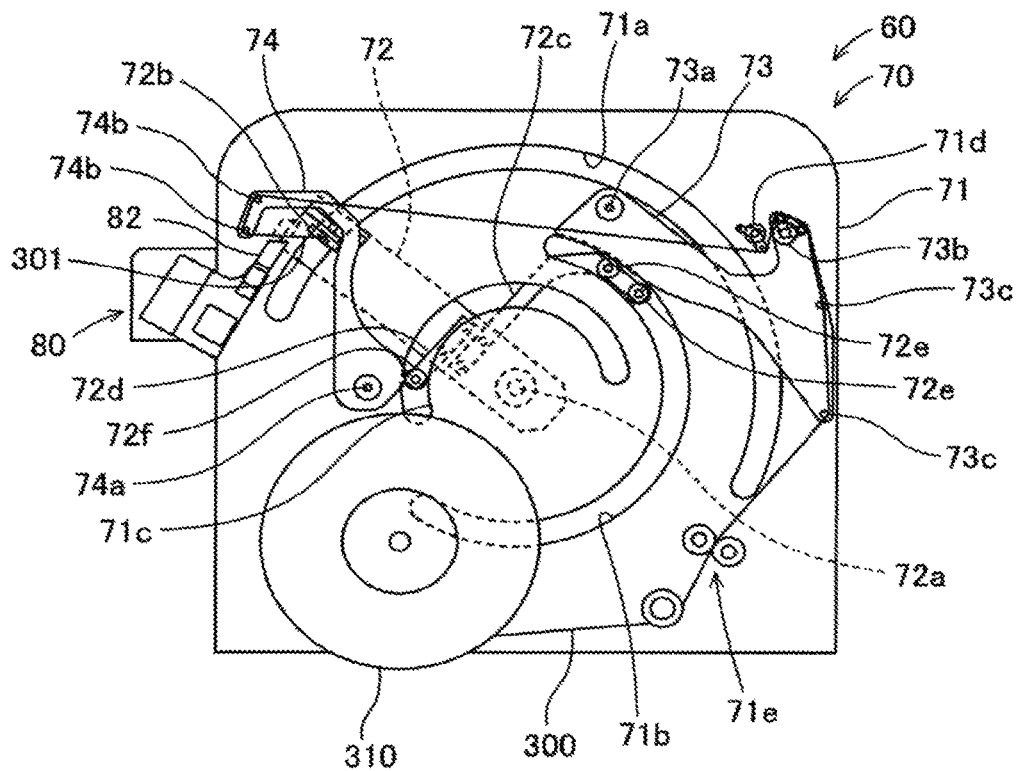
FIG. 13 is a plan view of a later stage of the operation of the temporary tape laying device 70 that the cover tape processing device has.

Further, when transfer section 72 is driven to rotate about 165° from the initial state, as shown in FIG. 13, the distal end portion of temporary tape 300 is moved to third position P3. When the processing described above is executed, temporary tape 300 is pulled out to a position corresponding to first tape holding section 133 of tape feeder 100 by transfer section 72. Then, temporary tape 300 is laid out into a shape along the path following the discharge path of cover tape 220 while the part of temporary tape 300, which is pulled in as a result of the transfer by transfer section 72, is being pushed out further by first pushing section 73 and is then formed into the shape.

More specifically, temporary tape 300 is formed into a curved shape like an S-shape by outer support pin mechanism section 71d of main body plate 71 and inner support pin mechanism section 73b of first pushing section 73. As this occurs, pins 73f, 73g are maintained at the initial interval by tension spring 73h in inner support pin mechanism section 73b. Then, in such a state that transfer section 72 rotates about 165° from the initial state, as shown in FIG. 13, while the part of temporary tape 300, which is pulled in as a result of the transfer by transfer section 72, is being pushed out by guide pins 74b of second pushing section 74, temporary tape 300 is formed into a U-shape so as to match cover tape 220 when temporary tape 300 is linked with cover tape 220 in a later stage. In this way, with temporary tape laying device 70, first pushing section 73 and second pushing section 74 are caused to operate in the interlocked fashion by rotating transfer section 72, so that temporary tape 300 is formed into the predetermined shape following the discharge path, whereby temporary tape 300 is laid out along the path of the predetermined shape and is then held in place.

Cover tape gripping device 75 is a device for gripping a distal end of cover tape 220 which is peeled off from base tape 210. Cover tape gripping device 75 is attached to main body plate 71 of temporary tape laying device 70 fixed to seat 61. Cover tape gripping device 75 may be attached to a side of main body plate 71 which faces second tape conveyance device 30 fixed to seat 34 and may be caused to advance in orthogonal direction Y when gripping is required.

Cover tape gripping device 75 has lower member 76 and upper member 77. Lower member 76 and upper member 77 are both formed into a block-like shape that can grip cover tape 220 which is peeled off from base tape 210. Lower member 76 is disposed at a lower portion of cover tape gripping device 75. Upper member 77 is disposed at an upper portion of cover tape gripping device 75 and is disposed above lower member 76. Lower member 76 and upper member 77 are made to move towards and away from each other. Lower member 76 and upper member 77 can move relatively in up-down direction Z. Lower member 76 and upper member 77 are spaced apart from each other before they grip cover tape 220 and are brought into abutment with each other when gripping cover tape 220 is required.

Additionally, cover tape gripping device 75 is mounted on main body plate 71 in such a manner as to reciprocate in orthogonal direction Y. The mounting position of cover tape gripping device 75 on main body plate 71 is a position where a distal end portion of cover tape 220 which protrudes from first tape holding section 133 of tape feeder 100 towards conveyance direction X can enter between lower member 76 and upper member 77 which are spaced apart from each other. Cover tape gripping device 75 can reciprocate in orthogonal direction Y by being so controlled. Cover tape gripping device 75 is retracted so as not to interrupt the rotation of second pushing section 74 before it grips cover tape 220 and is caused to advance so as to grip cover tape 220 when gripping cover tape 220 is required. Lower member 76 and upper member 77 are kept spaced apart from each other until cover tape gripping device 75 completes an advancement in orthogonal direction Y and are then brought into abutment with each other after cover tape gripping device 75 completes the advancement. When the abutment is completed, the distal end portion of cover tape 220 is held between lower member 76 and upper member 77 and is then gripped in place.

Linking device 80 is a device for linking temporary tape 300 which is held by temporary tape laying device 70 in the way described above with a distal end side of cover tape 220 which is peeled off from base tape 210 of carrier tape 200 at first tape holding section 133 of tape feeder 100. This linking of the tapes is realized by heat-bonding cover tape 220 and temporary tape 300 together. Then, this heat-bonding is executed so that a fold is formed in a halfway position of a bonding portion where cover tape 220 and temporary tape 300 are bonded together in a tape's longitudinal direction.

Linking device 80 is attached to main body plate 71 of temporary tape laying device 70 fixed to seat 61. Linking device 80 has tape support member 81 and heating member 82. Either or a first member of tape support member 81 and heating member 82 of linking device 80 may be attached to second tape conveyance device 30 fixed to seat 34 in place of main body plate 71 described above. In this case, linking device 80 attached to second tape conveyance device 30 may be made to advance in orthogonal direction Y when linking is required.

Tape support member 81 is a tape presser for supporting the distal end portions of cover tape 220 and temporary tape 300 in such a state the distal end portions of the tapes overlap each other when cover tape 220 and temporary tape 300 are linked together. Tape support member 81 is a member having a rectangular block-like shape. Tape support member 81 is mounted on main body plate 71 in such a manner as to reciprocate in orthogonal direction Y. The mounting position of tape support member 81 on main body plate 71 lies inside a U-shaped portion of temporary tape 300 which is formed into the U-shape by temporary tape laying device 70 and above the distal end portion of cover tape 220 which protrudes from first tape holding section 133 of tape feeder 100 in conveyance direction X. Tape support member 81 can reciprocate in orthogonal direction Y by being so controlled. Tape support member 81 is retracted so as not to interrupt the rotation of second pushing section 74 before temporary tape laying device 70 holds temporary tape 300 in such a state that temporary tape 300 follows the predetermined path and is caused to advance so as to support tapes 220, 300 after temporary tape laying device 70 has so held temporary tape 300.

Figure 14:
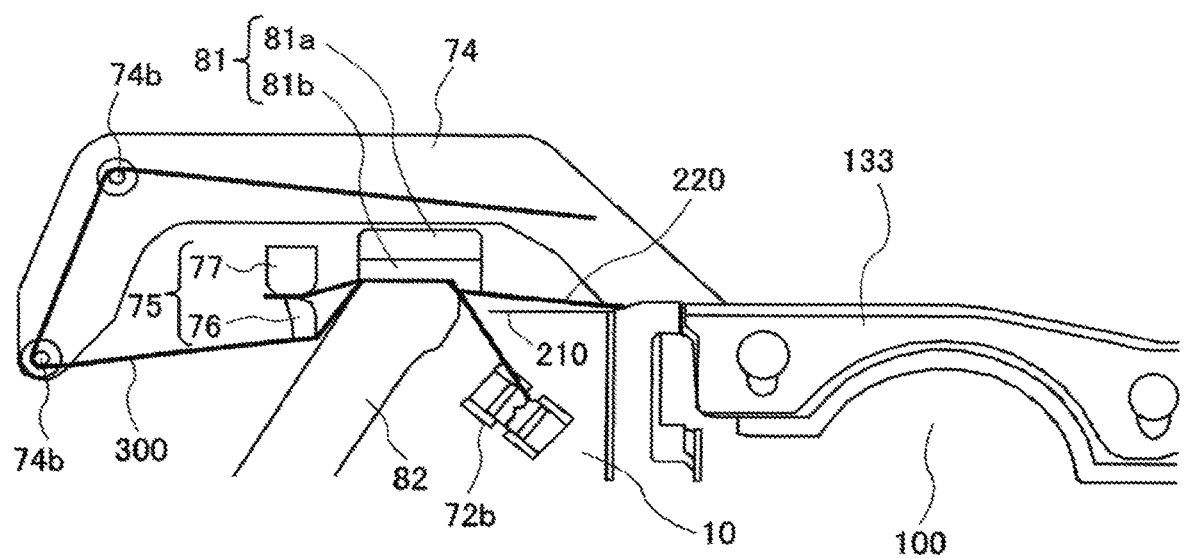
FIG. 14 is a diagram illustrating a link of a cover tape with a temporary tape by a linking device that the tape auto-loading device includes.
Figure 15:
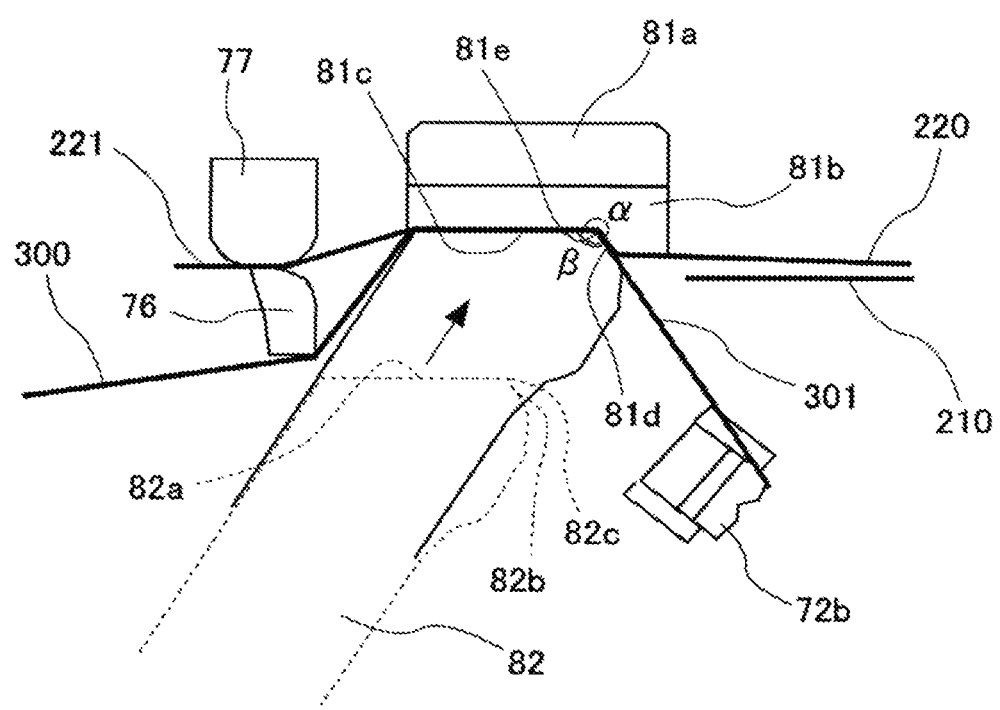
FIG. 15 is an enlarged view showing a state in which the linking device links the cover tape with the temporary tape.

Tape support member 81 has metal section 81a and resin section 81b. Metal section 81a is disposed at an upper portion of tape support member 81. Resin section 81b is disposed at a lower portion of tape support member 81 and is fixed to a lower face of metal section 81a. Tape support member 81 supports the distal end portions of cover tape 220 and the distal end portion of temporary tape 300 in such a state that the distal end portions of the tapes overlap each other at a lower face of resin section 81b. Resin section 81b is formed in such a manner that the lower face is bent towards conveyance direction X. Specifically speaking, as shown in FIGS. 14 and 15, the lower face of resin section 81b is formed into an angularly recessed shape in which two faces are formed with root bend corner section 81e defined therebetween.

That is, the lower face of resin section 81b has horizontal section 81c, slope section 81d, and root bend corner section 81e. Horizontal section 81c constitutes a lower face expanding substantially horizontally while being directed downwards. Slope section 81d constitutes a lower face which lies rearwardly adjacent to horizontal section 81c while being directed obliquely downwards. Root fold corner portion 81e is formed between horizontal section 81c and slope section 81d in such a manner as to extend into a straight line in orthogonal direction Y. Resin section 81b is formed in such a manner that an angle α formed by horizontal section 81c and slope section 81d via a main body side of resin section 81b at root bend corner section 81e becomes, for example, about 230 degrees or the like which exceeds 180 degrees.

Heating member 82 is a member for heat-bonding cover tape 220 and temporary tape 300 together by holding the distal end portion of cover tape 220 and the distal end portion of temporary tape 300 between tape support member 81 and itself. Heating member 82 is a member which is formed into an arc-like shape. Heating member 82 is mounted on main body plate 71 in such a manner as to move vertically in up-down direction Z (specifically speaking, obliquely in the up-down direction). Heating member 82 is disposed on main body plate 71 in such a manner as to overlap a rotational position of second pushing section 74 of temporary tape laying device 70. The position where heating member 82 is so disposed constitutes a position where heating member 82 overlaps tape support member 81 at an advancing position of tape support member 81. Heating member 82 can move obliquely in the up-down direction by being so controlled so as to move towards and away from tape support member 81 staying in the advancing position. Heating member 82 is positioned downwards before the heat-bonding is executed and is then caused to move obliquely upwards, when the heat-bonding is required, until an upper face thereof is brought into abutment with a lower face of tape support member 81.

Heating member 82 has the upper face matching the lower face of tape support member 81. Heating member 82 can hold the distal end portion of cover tape 220 and the distal end portion of temporary tape 300 in such a state that the distal end portions of the tapes overlap each other between the upper face thereof and the lower face of tape support member 81. Heating member 82 can be heated to a predetermined temperature (for example, 170° C.) at an upper face portion thereof by being so controlled. Heating member 82 is formed in such a manner that the upper face is bent toward conveyance direction X. Specifically speaking, the upper face of heating member 82 is formed into an angularly projecting shape in which two faces are formed with a ridge bend corner section 82c defined therebetween.

That is, the upper face of heating member 82 has horizontal section 82a, slope section 82b, and ridge bend corner section 82c. Horizontal section 82a constitutes an upper face expanding substantially horizontally while being directed upwards. Slope section 82b constitutes an upper face lying rearwardly adjacent to horizontal section 82a while being directed obliquely upwards. Slope section 82b is formed in such a manner as to match slope section 81d of tape support member 81. Ridge fold corner section 82c is formed in such a manner as to extend into a straight line in orthogonal direction Y between horizontal section 82a and slope section 82b. Heating member 82 is formed in such a manner that an angle β formed by horizontal section 82a and slope section 82b via a main body side of heating member 82 at ridge bend corner section 82c becomes, for example, about 130° or the like which is less than 180°. This angle β is set so that a total angle of angle α and angle β (α+β) of resin section 81b becomes 360 degrees.

The obliquely upward direction in which heating member 82 is caused to move until it comes into abutment with the lower face of tape support member 81 when the heating bonding is required is a direction which bisects angle α of root bend corner section 81e of tape support member 81 and angle β of ridge bend corner section 82c of heating member 82. That is, in heat-bonding cover tape 220 and temporary tape 300 together between tape support member 81 and itself, heating member 82 is caused to move in the direction which bisects both angle α and angle β described above.

Transfer device 90 is a device for transferring temporary tape 300 which is linked with the distal end portion of cover tape 220 from temporary tape laying device 70 to tape feeder 100. Transfer device 90 executes a transferring process of temporary tape 300 by controlling the operation of temporary tape laying device 70 and the operation of second release device 50.

Next, the operation of the tape auto-loading device 1 will be described by use of FIGS. 16 to 24. In tape auto-loading device 1, in its initial state, as shown in FIG. 1, first tape conveyance device 20 and second tape conveyance device 30, first release device 40 and second release device 50, and cover tape processing device 60 are all spaced apart from feeder holding stand 10 at the predetermined intervals in orthogonal direction Y. In addition, temporary tape laying device 70 of cover tape processing device 60 forms temporary tape 300 into the shape along the path following the discharge path of cover tape 220 and holds it in place in advance by operating described above. The forming and holding of temporary tape 300 by temporary tape laying device 70 only needs to be completed before temporary tape 300 is linked with cover tape 220 by linking device 80, and hence, the forming and holding of temporary tape 300 may be executed simultaneously with, for example, a conveyance of carrier tape 200 by tape feeder 100.

In the initial state described above, the operator sets tape feeder 100 on feeder holding stand 10. Specifically speaking, a bottom face of feeder main body 110 is placed between pair of support guides 13 on placement section 11 so as to be held therebetween, and positioning pins and a communication connector of feeder main body 110 are inserted into corresponding positioning sections 15 and communication jack 14 of abutting section 12. Then, tape reel 240 is attached to reel accommodation section 120, and a feeder setting completion button is depressed which is provided as a control device for tape auto-loading device 1.

Figure 16:
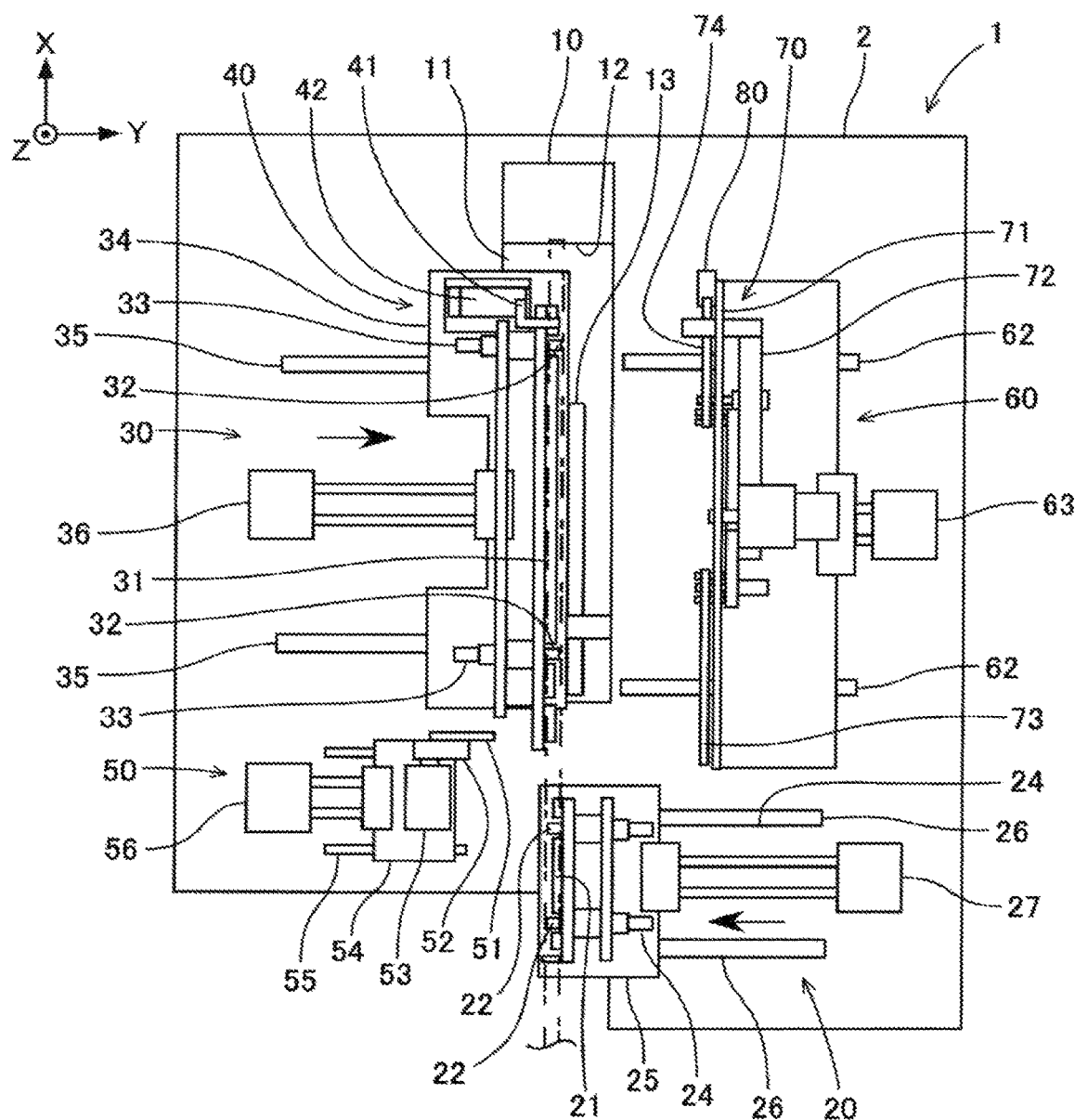
FIG. 16 is a top view showing a state in which the first tape conveyance device and the second tape conveyance device approach the feeder holding stand.

When the feeder setting completion button is depressed, first tape conveyance device 20 and second tape conveyance device 30 are caused to slide in orthogonal direction Y to approach feeder holding stand 10. Then, as shown in FIG. 16, first tape conveyance device 20 and second tape conveyance device 30 are positioned so that the positions of respective guides 21, 31 in orthogonal direction Y coincide with the position of tape feed guide 111 of tape feeder 100 in orthogonal direction Y.

In addition, as second tape conveyance device 30 is caused to slide to move as described above, first release device 40 is caused to slide in an associated fashion. In this case, first lift lever 41 of first release device 40 is inserted into an activation allowing side for lever 138 of first tape holding section 133 of tape feeder 100. Then, when support table 42 of first release device 40 is caused to rise in up-down direction Z, first lift lever 41 uplifts lever 138 of first tape holding section 133. When lever 138 is uplifted, first tape holding section 133 rotates upwards about rotation fulcrum 133a of first tape holding section 133, whereby the holding state between first tape holding section 133 and sprocket 131 is released.

Here, the operator pulls out carrier tape 200 from tape reel 240 accommodated in reel accommodation section 120 and inserts a distal end portion of carrier tape 200 (specifically speaking, a distal end portion of cover tape 220) into a rear end portion of guides 21 of first tape conveyance device 20. When the insertion of the distal end portion of cover tape 220 is executed, the distal end portion of cover tape 220 is detected by a sensor, not shown, whereby gear motors 24, 33 and motor 132 are driven. When motors 24, 33, 132 are driven, carrier tape 200 is fed out in conveyance direction X and is guided by guides 21, 31, and tape feed guide 111, whereby carrier tape 200 is conveyed to a position where carrier tape 200 passes through a gap defined between first tape holding section 133 and sprocket 131.

When carrier tape 200 is conveyed as far as first tape holding section 133, the driving of motors 24, 33, 132 is stopped, and support table 42 and first lift lever 41 of first release device 40 are caused to be lowered, whereby lever 138 of first tape holding section 133 is lowered. When lever 138 is lowered, first tape holding section 133 rotates downwards about rotation fulcrum 133a, resulting in a state in which carrier tape 200 is held between first tape holding section 133 and sprocket 131. When motor 132 is driven in such a state, sprocket 131 is rotated, whereby carrier tape 200 is conveyed to such an extent that the distal end portion thereof protrudes from first tape holding section 133 by a predetermined amount in conveyance direction X.

Figure 17:
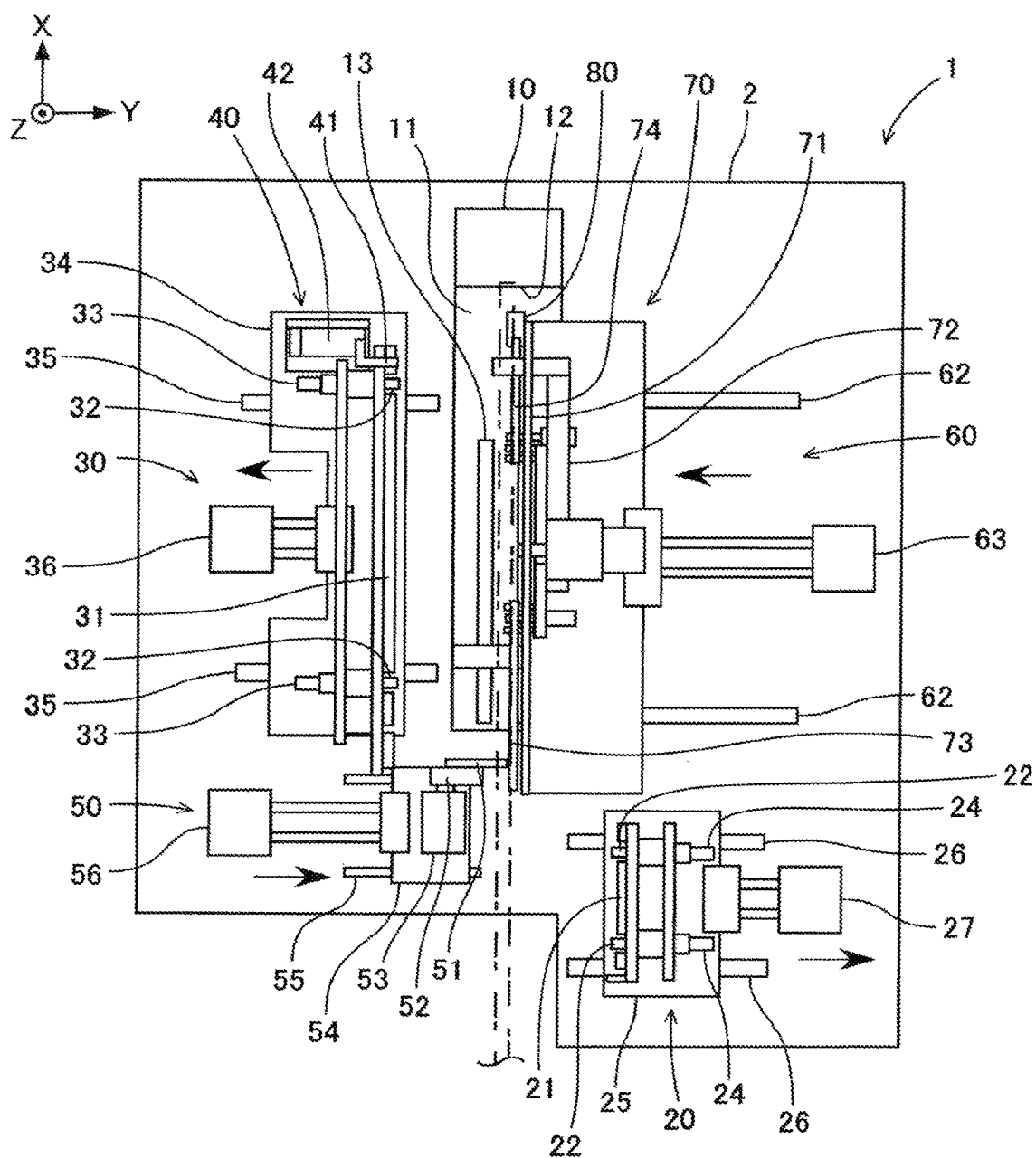
FIG. 17 is a top view showing a state in which the second release device and the cover tape processing device approach the feeder holding stand.

Subsequently, as shown in FIG. 17, first tape conveyance device 20 and second tape conveyance device 30 are individually caused to slide in orthogonal directions Y in which they move away from feeder holding stand 10. Further, second release device 50 is caused to slide in orthogonal direction Y in which second release device 50 moves towards feeder holding stand 10. In this case, second lift lever 51 of second release device 50 is inserted into an activation allowing side for lever 146 of second tape holding section 143 of tape feeder 100. Then, when support table 52 of second release device 50 is caused to move in conveyance direction X, arm 145 of second tape holding section 143 is caused to rotate about rotation fulcrum 145a at the rear end side of feeder main body 110 by second lift lever 51. In this case, gear 144 of second tape holding section 143 moves away from gear 141 of cover tape feeding mechanism section 140, whereby the holding state between gear 144 and gear 141 is released.

With gear 144 and gear 141 of cover tape feeding mechanism section 140 left released, cover tape processing device 60 is caused to slide in orthogonal direction Y in which cover tape processing device 60 moves towards feeder holding stand 10. As this occurs, temporary tape laying device 70 stays in the state in which temporary tape laying device 70 forms temporary tape 300 into the shape matching the path following the discharge path of cover tape 220 in advance and holds it in place. Then, cover tape processing device 60 is positioned so that the position in orthogonal direction Y of temporary tape 300 held by temporary tape laying device 70 coincides with the position in orthogonal direction Y of carrier tape 200 held by tape feeder 100.

Figure 18:
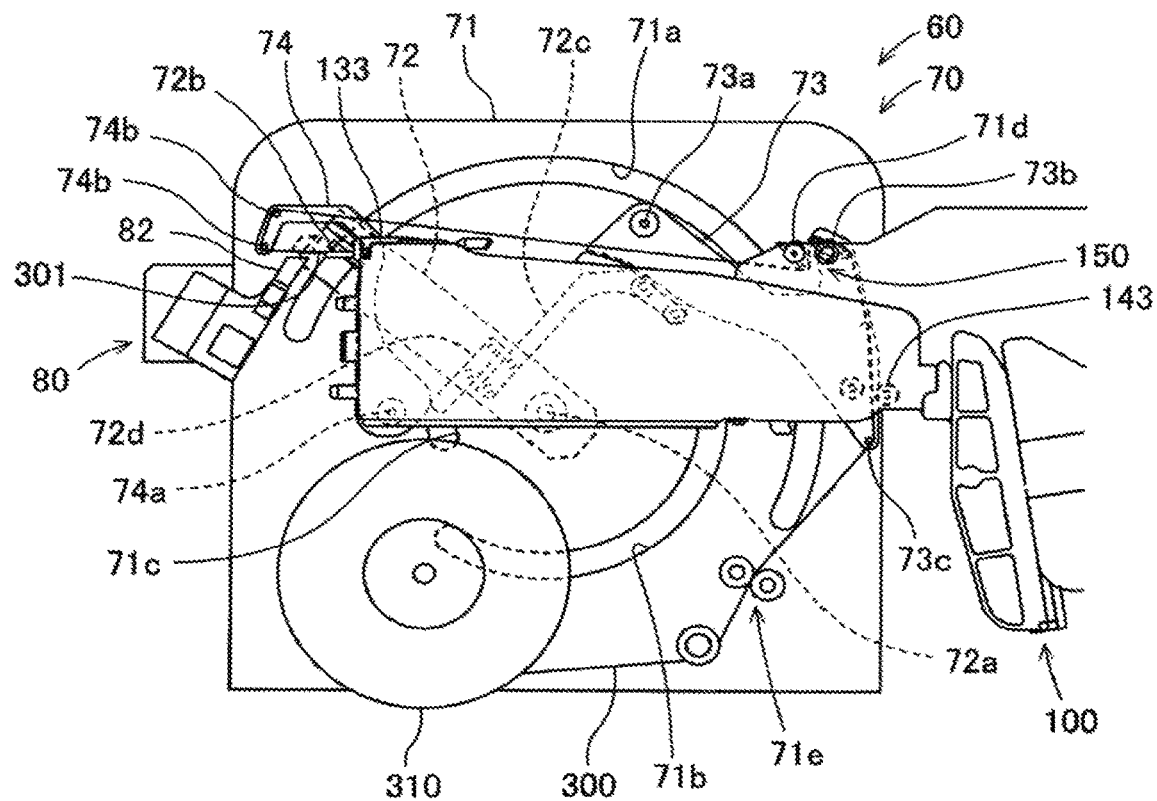
FIG. 18 is a plan view showing the tape feeder and the cover tape processing device as viewed partially through the cover tape processing device.
Figure 19:
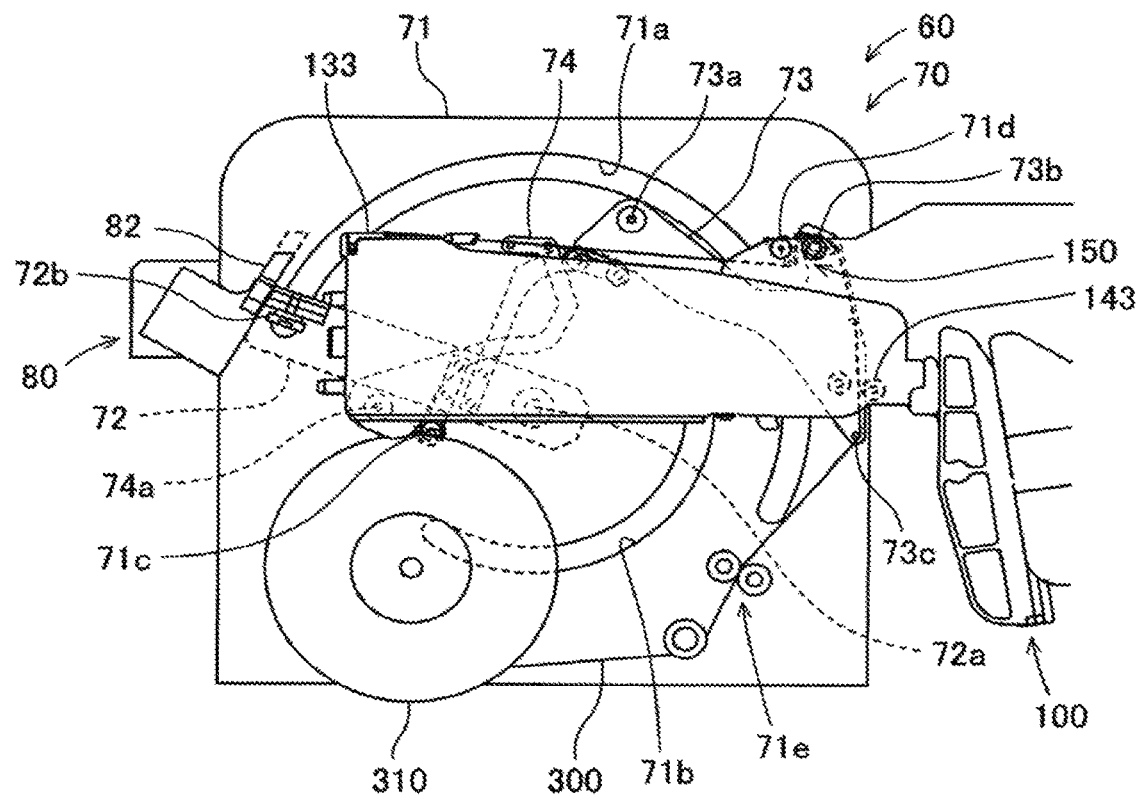
FIG. 19 is a diagram illustrating an operation in which the temporary tape is transferred to the tape feeder.
Figure 20:
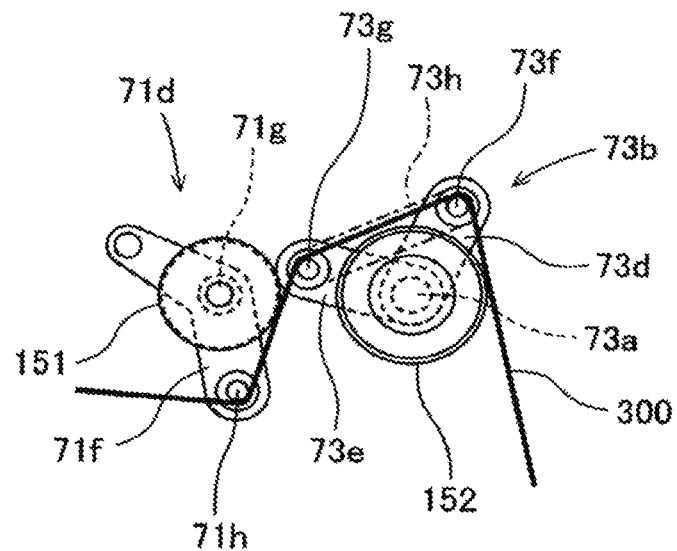
FIG. 20 is a diagram illustrating a state in which the temporary tape is held with multiple pins when the temporary tape is transferred to the tape feeder.

This positioning is executed so that the distal end portion of temporary tape 300 is positioned below the distal end portion of cover tape 220 which protrudes from first tape holding section 133 of tape feeder 100 toward conveyance direction X, whereby the distal end portion of temporary tape 300 faces the distal end portion of cover tape 220, as shown in FIG. 18. In addition, this positioning is executed so that lower member 76 and upper member 77 of cover tape gripping device 75 are positioned so as to face each other vertically with the distal end portion of cover tape 220 that protrudes from first tape holding section 133 of tape feeder 100 in conveyance direction X held therebetween. Further, the portion of temporary tape 300 which is positioned between two guide pins 73c of first pushing section 73 is positioned so as to pass between gear 141 of cover tape feeding mechanism section 140 and gear 144 of second tape holding section 143, gear 141 and gear 144 being spaced apart from each other. Furthermore, the portion of temporary tape 300 which is curved into the S-like shape by outer support pin mechanism section 71d and inner support pin mechanism section 73b is positioned so as to pass between two guide rollers 151, 152 of cover tape feed guide 150 of tape feeder 100, as shown in FIG. 20.

When the positionings described above are executed, lower member 76 and upper member 77 of cover tape gripping device 75 are caused to move towards each other, so as to grip the distal end portion of cover tape 220 which protrudes from first tape holding section 133 of tape feeder 100 in conveyance direction X therebetween. In addition, before or after the distal end portion of cover tape 220 is so gripped, tape support member 81 of linking device 80 is caused to advance in orthogonal direction Y so as to support tapes 220, 300. Then, when the distal end portion of cover tape 220 is gripped and tape support member 81 is caused to advance, heating member 82 is caused to move obliquely upwards until heating member 82 is brought into abutment with the lower face of tape support member 81. When heating member 82 and tape support member 81 are brought into abutment with each other, cover tape 220 and temporary tape 300 are held between heating member 82 and tape support member 81 in such a state that cover tape 220 and temporary tape 300 overlap each other.

When cover tape 220 and temporary tape 300 are held between heating member 82 and tape support member 81 in such a state that heating member 82 is heated, cover tape 220 and temporary tape 300 in question are heated by heating member 82 so heated. When the heating described above is executed, an adhesive remaining on a peeled face of cover tape 220 resulting when cover tape 220 is peeled off from base tape 210 is softened through the heating process, thereby allowing the adhesive to function as an adhesive again. As a result, cover tape 220 and temporary tape 300 are bonded together with the adhesive at the portions thereof which are held by heating member 82 and tape support member 81 to thereby be linked with each other.

When cover tape 220 and temporary tape 300 are linked with each other, heating member 82 is caused to move obliquely downwards so as to move away from tape support member 81, and tape support member 81 is retracted in orthogonal direction Y. Further, the gripping of temporary tape 300 by gripping claw 72b of transfer section 72 is canceled for release. Then, thereafter, temporary tape 300 held by temporary tape laying device 70 is transferred to tape feeder 100.

Specifically speaking, the transfer of temporary tape 300 described above is executed, firstly, as a result of transfer section 72 of temporary tape laying device 70 being rotated further in the same direction (a counterclockwise direction in FIG. 19) as the direction in which transfer section 72 is rotated until transfer section 72 reaches third position P3 from the initial state. When transfer section 72 rotates in the direction described above, contact roller 72f of transfer section 72 is dislocated from the back face section of second pushing section 74, whereby second pushing section 74 is rotated in a reverse direction (a clockwise direction in FIG. 19) by the elastic member to thereby return to the initial state. As this occurs, temporary tape 300 is bent through 180 degrees from first tape holding section 133 as a basic point together with cover tape 220 with which temporary tape 300 is linked and is then supported by pin 71h of outer support pin mechanism section 71d while being pulled rearwards in conveyance direction X. Thereafter, transfer device 90 rotates temporary tape reel 310 in a reverse direction (the clockwise direction in FIG. 19) to the direction in which temporary tape 300 is pulled out. As a result of temporary tape reel 310 being rotated in that way, temporary tape 300, which is loosened when second pushing section 74 returns to the initial position, is wound up.

Figure 21:
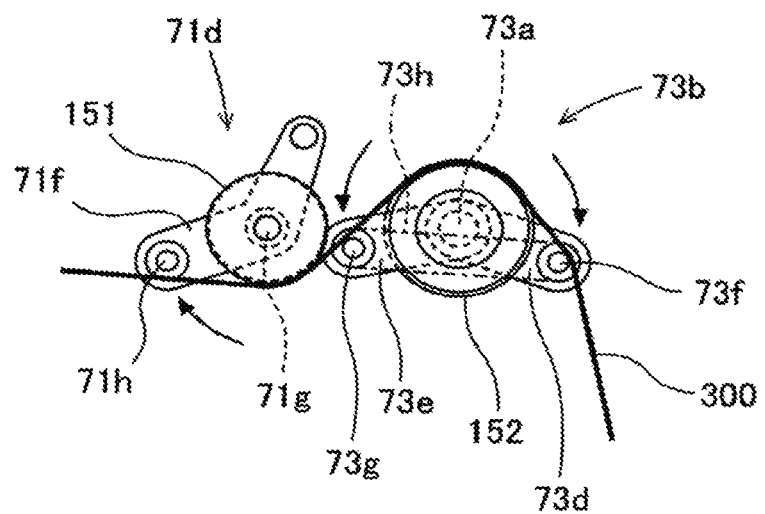
FIG. 21 is a diagram showing a state in which the temporary tape is transferred to a guide roller of a cover tape feeding guide.

Further, when transfer device 90 rotates temporary tape reel 310 in the reverse direction, the tension of temporary tape 300 is increased while tape feeding mechanism section 130 of tape feeder 100 is stopped. When the tension of temporary tape 300 is increased, as shown in FIG. 21, temporary tape 300 passes both sides of guide roller 152 of tape feeder 100 while two pins 73f, 73g expand a space therebetween or are spaced apart further against the elastic force of tension spring 73h of inner support pin mechanism section 73b. In this case, temporary tape 300 held by two pins 73f, 73g is transferred to guide roller 152. Similarly, pin 71h of outer support pin mechanism section 71d moves to the distal end side of tape feeder 100, whereby temporary tape 300 held by pin 71h is transferred to guide roller 151 of tape feeder 100.

When temporary tape 300 is transferred to tape feeder 100, transfer device 90 activates second release device 50, causing second release device 50 to hold temporary tape 300. When second release device 50 is so activated, support table 52 of second release device 50 is caused to move in conveyance direction X by the biasing force of coil spring 147, whereby arm 145 of second tape holding section 143 is rotated about rotation fulcrum 145a at the front end side of feeder main body 110. In this case, temporary tape 300 is held between gear 144 of second tape holding section 143 and gear 141 of cover tape feeding mechanism section 140.

Then, cover tape processing device 60 causes a tape cutter, not shown, to cut temporary tape 300 between second tape holding section 143 and temporary tape reel 310. After temporary tape 300 is so cut, as shown in FIG. 6, temporary tape 300 is put in a state in which the tape is transferred to tape feeder 100. As this occurs, although there is a possibility that temporary tape 300 interferes with carrier tape 200 being conveyed, temporary tape 300 is locked by a cutout section provided in feeder main body 110 in such a manner as to straddle carrier tape 200, whereby temporary tape 300 can be prevented from interfering with carrier tape 200.

After temporary tape 300 is so cut, cover tape processing device 60 is moved in orthogonal direction Y in which cover tape processing device 60 moves away from feeder holding stand 10. Additionally, after temporary tape 300 is so cut, transfer section 72 is returned to the initial angle. Further, motor 132 is driven to rotate sprocket 131, whereby base tape 210 is caused to prepare itself for supplying components accommodated thereon, so that a component is positioned in component suction position L. Thus, as a result of completing the series of operations described above, automatic setting of carrier tape 200 in tape feeder 100 by tape auto-loading device 1 is finished.

In tape auto-loading device 1 described above, carrier tape 200 can be conveyed from reel accommodation section 120 where tape reel 240 is accommodated to tape feeding mechanism section 130 by way of tape feed guide 111 by first tape conveyance device 20 and second tape conveyance device 30. Further, temporary tape 300 is heat-bonded to cover tape 220 of carrier tape 200 and is then transferred to tape feeder 100 by cover tape processing device 60, whereby cover tape 220 can be discharged to the outside of feeder main body 110 along the discharge path. That is, with cover tape processing device 60, cover tape 220 can be held by second tape holding section 143 by use of temporary tape 300 without cover tape 220 itself of carrier tape 200 having had to directly be laid out along the discharge path. That is, carrier tape 200 can automatically be loaded in tape feeder 100.

In addition, in causing cover tape 220 to be held by second tape holding section 143, firstly, cover tape 300 is laid out along the path following the discharge path of cover tape 220 and is then linked with the distal end portion of cover tape 220, whereafter temporary tape 300 in question is transferred to tape feeder 100, whereby cover tape 220 is indirectly laid out along the discharge path. Consequently, in laying out cover tape 220 along the discharge path, as long as a length corresponding to the portion where cover tape 220 is bonded to temporary tape 300 is provided as an amount by which cover tape 220 is pulled out from carrier tape 200, the length so provided is good enough, and hence, since the length does not have to be too long, carrier tape 200 can be loaded in tape feeder 100 without discarding too many components on carrier tape 200 wastefully.

Linking device 80 links cover tape 220 and temporary tape 300 together through heating process. This linking is executed using the adhesive remaining on the peeled face of cover tape 220 peeled off from base tape 210. That is, the surface where cover tape 220 is heat-bonded to temporary tape 300 is the peeled face. As a result, linking of cover tape 220 with temporary tape 300 can easily be realized by making reuse of the adhesive remaining on the peeled face without using another adhesive separately.

Further, heat-bonding of cover tape 220 to temporary tape 300 executed by linking device 80 is executed by holding the portions of cover tape 220 and temporary tape 300 which overlap each other with tape support member 81 and heating member 82. Hereinafter, the portions of cover tape 220 and temporary tape 300 which are held to be heat-bonded together will be referred to as bonding portion S. For such heat-bonding, tapes 220, 300 are held together between the lower face of tape support member 81 and the upper face of heating member 82. The lower face of tape support member 81 (specifically speaking, resin section 81b) is formed into the angularly recessed shape in which horizontal section 81c and slope section 81d are formed with root bend corner section 81e defined therebetween. The upper face of heating member 82 is formed into the angularly projecting shape in which horizontal section 82a and slope section 82b are formed with ridge bend corner section 82c defined therebetween. The angularly recessed shape of tape support member 81 and the angularly projecting shape of heating member 82 correspond to each other.

Tape support member 81 and heating member 82 hold cover tape 220 and temporary tape 300 in such a state that cover tape 220 and temporary tape 300 are bent along root bend corner section 81e and ridge bend corner section 82c, respectively, at the halfway positions in the longitudinal direction of the tapes. When the holding of cover tape 220 and temporary tape 300 is executed in the manner described above, folds 221, 301, which extend into a straight line in a tape's transverse direction, are formed at a halfway position in the tape's longitudinal direction of bonding portion S where cover tape 220 and temporary tape 300 are bonded together while overlapping each other. Folds 221, 301 of cover tape 220 and temporary tape 300 formed on bonding portion S constitute ridge bends projecting upwards when cover tape 220 and temporary tape 300 are so held together.

In addition, when holding of cover tape 220 and temporary tape 300 is executed, a non-adhesive section (hereinafter, referred to as "distal end-side non-adhesive section 222") remains at a portion of cover tape 220 that lies further distal than bonding portion S, and a non-adhesive section (hereinafter, referred to as "distal end-side non-adhesive section 302") remains at a portion of temporary tape 300 that lies further distal than bonding portion S. Distal end-side non-adhesive sections 222, 302 are always formed in gripping cover tape 220 or temporary tape 300 when the tapes are held as described above.

Figure 22:
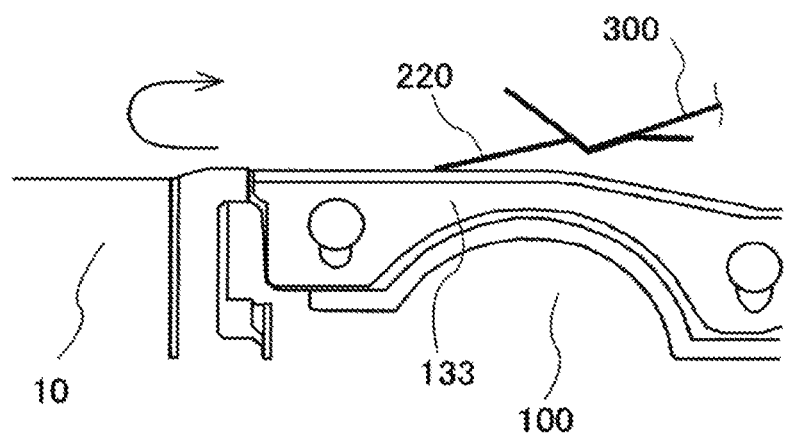
FIG. 22 is a diagram showing a state in which the temporary tape is transferred to the tape feeder after the cover tape is linked with the temporary tape.
Figure 23:
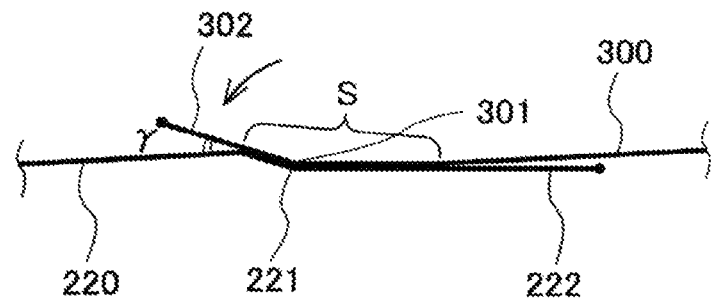
FIG. 23 is a diagram illustrating a state in which the cover tape and the temporary tape are linked together by the linking device.

In the process of temporary tape 300, with which cover tape 220 is linked, being transferred to tape feeder 100, as shown in FIG. 22, temporary tape 300 in question is bent through 180 degrees from first tape holding section 133 as the basic point together with cover tape 220 and is pulled rearwards in conveyance direction X. When the folding of the tapes is executed as described above, folds 221, 301 at respective bonding portions S of cover tape 220 and temporary tape 300 come to constitute rood folds projecting downwards. As this occurs, as shown in FIG. 23, since distal end-side non-adhesive section 222 of cover tape 220 is positioned below temporary tape 300 which is being pulled rearwards to overlap temporary tape 300 from below, distal end-side non-adhesive section 222 is put in a state in which an upper portion thereof is pressed down. As a result, distal end-side non-adhesive section 222 of cover tape 220 is prevented from rising to move upwards.

Figure 24:
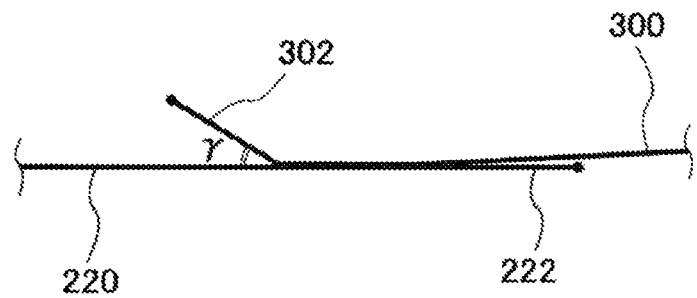
FIG. 24 is a diagram illustrating a state in which a cover tape and a temporary tape are linked together in a comparison example that is compared with the embodiment.

On the other hand, for distal end-side non-adhesive section 302 of temporary tape 300, there exists no member for pressing down an upper portion of distal end-side non-adhesive section 302 when temporary tape 300 is pulled rearwards. For this reason, in the event that no fold is formed in the halfway position in the tape's longitudinal direction of bonding portion S, distal end-side non-adhesive section 302 in question is allowed to rise to move upwards as shown in FIG. 24. This rising amount becomes greater as angle γ formed by cover tape 220 and the distal end portion of temporary tape 300 in the initial stage of heat-bonding becomes greater.

In contrast with this, in this embodiment, fold 301 is formed in the halfway position in the tape's longitudinal direction of bonding portion S of temporary tape 300. That is, bonding portion S where cover tape 220 and temporary tape 300 are bonded together extends over regions lying across folds 221, 301 in the tape's longitudinal direction. In this structure, when temporary tape 300 is bent through 180 degrees from first tape holding section 133 as the basic point together with cover tape 220 and is pulled rearwards in conveyance direction X in the process of temporary tape 300 being transferred to tape feeder 100, bonding portion S residing forwards and rearwards of folds 301, 221 of temporary tape 300 and cover tape 220 is stretched so as to eliminate folds 301, 221 in question by the tension of temporary tape 300.

That is, when temporary tape 300 is pulled rearwards as described above, the tension thereof acts on the whole of bonding portion S of temporary tape 300 and cover tape 220, bonding portion S of cover tape 220 is stretched into a straight line over the whole area in the tape's longitudinal direction in such a manner as to eliminate fold 221. When boding portion S of cover tape 220 is stretched as described above, as shown in FIG. 23, bonding portion S of temporary tape 300 which is bonded to cover tape 220 in question is stretched into a straight line over the whole area in the tape's longitudinal direction in such a manner as to eliminate fold 301. As this occurs, angle γ formed by cover tape 220 and temporary tape 300 becomes smaller than that resulting in the initial stage of heat-bonding.

Therefore, according to the present embodiment, even though the angle formed by cover tape 220 and temporary tape 300 in the initial stage of heat-bonding is great, the distal end side of temporary tape 300 including distal end-side non-adhesive section 302 which lies further distal than fold 301 can be lowered, whereby distal end-side non-adhesive section 302 of temporary tape 300 can be prevented from rising to move upwards or the rising amount of distal end-side non-adhesive section 302 can be prevented from being increased. As a result, an interference with the component mounting head attributed to an excessive rising of distal end-side non-adhesive section 302 of temporary tape 300 or a fall of a component attributed to such an interference, if any, can be suppressed. In addition, the prevention of rising of temporary tape 300 is realized by making a fold on bonding portion S. Therefore, since a rising section of temporary tape 300 does not have to be eliminated through manual work (cutting work) by the operator, the working efficiency can be increased remarkably.

Heat bonding of cover tape 220 and temporary tape 300 by linking device 80 is executed as a result of heating member 82 moving obliquely upwards until its upper face is brought into abutment with the lower face of tape support member 81. In heat-bonding cover tape 220 and temporary tape 300 between tape support member 81 and heating member 82, heating member 82 is moved in the direction which bisects angle α of root bend corner section 81e of tape support member 81 and angle β of ridge bend corner section 82c of heating member 82. Then, the upper face of heating member 82 is brought into abutment with the lower face of tape support member 81, whereby cover tape 220 and temporary tape 300 are linked with each other in the overlapping state while the folds are being made thereon.

In this configuration, when tape support member 81 and heating member 82 of linking device 80 are brought into abutment with each other, cover tape 220 and temporary tape 300, which overlap each other, are put in the state in which the two faces, which pinch the portion pinched by root bend corner section 81e of tape support member 81 and ridge bend corner section 82c of heating member 82 forwards and rearwards in conveyance direction X, are held with a uniform force. As a result, folds 221, 301 can be made on bonding portion S of cover tape 220 and temporary tape 300 in an ensured fashion even with a small magnitude of force. Therefore, the configuration necessary for forming folds 221, 301 on bonding portion S can be made compact in size while forming folds 221, 301 into the desired shapes.

Incidentally, in the embodiment that has been described heretofore, temporary tape 300 is described as being allowed to rise to move upwards after temporary tape 300 is linked with cover tape 220. However, the present disclosure is not limited thereto. The present disclosure may be applied to a configuration in which cover tape 220 is allowed to rise to move upwards after cover tape 220 is linked with temporary tape 300.

In the embodiment that has been described heretofore, heating member 82 is described as moving obliquely upwards. However, the present disclosure is not limited thereto. The present disclosure may be applied to a configuration in which tape support member 81 moves obliquely downwards, as long as heating member 82 and tape support member 81 move relatively.

In the embodiment that has been described heretofore, tape support member 81 is described as being disposed at the upper portion of linking device 80, while heating member 82 is described as being disposed at the lower portion of linking device 80. However, the present disclosure is not limited thereto. The present disclosure may be applied to a configuration in which tape support member 81 is disposed at the lower portion of linking device 80, while heating member 82 is disposed at the upper portion of linking device 80.

Further, in the embodiment that has been described heretofore, tape support member 81 is described as being formed into the angularly recessed shape having root bend corner portion 81e, while heating member 82 is formed into the angularly projecting shape having ridge bend corner portion 82c. However, the present disclosure is not limited thereto, and on the contrary, the present disclosure may be applied to a configuration in which tape support member 81 is formed into the angularly projecting shape having the ridge bend corner portion, while heating member 82 is formed the angularly recessed shape having the root bend corner portion.

The present disclosure is not limited to the embodiment that has been described heretofore and modified examples made thereto, and hence, various modifications can be made thereto without departing from the spirit and scope of the present disclosure.

REFERENCE SIGNS LIST

1: Tape auto-loading device, 2: Base plate, 10: Feeder holding stand, 60: Cover tape processing device, 70: Temporary tape laying device, 75: Cover tape gripping device, 80: Linking device, 81: Tape support member, 81c: Horizontal section, 81d: Slope section, 81e: Root fold corner section, 82: Heating member, 82a: Horizontal section, 82b: Slope section, 82c: Ridge fold corner section, 90: Transfer device, 100: Tape feeder, 200: Carrier tape, 210: Base tape, 220: Cover tape, 300: Temporary tape.

The invention claimed is:

1. A tape auto-loading device for loading a carrier tape in a tape feeder in which a cover tape is peeled off from a base tape of the carrier tape and the cover tape so peeled off is discharged therefrom along a predetermined path, the tape auto-loading device comprising:
a temporary tape laying device configured to lay a temporary tape along a path following the predetermined path and hold the temporary tape in position;
a cover tape gripping device configured to grip a distal end of the cover tape which is peeled off from the base tape;
a linking device configured to link the temporary tape held by the temporary tape laying device to a distal end portion of the cover tape gripped by the cover tape gripping device; and
a transfer device configured to transfer the temporary tape linked to the distal end portion of the cover tape from the temporary tape laying device to the tape feeder,
wherein the linking device comprises:
a tape support member configured to support the distal end portion of the cover tape and the temporary tape in such a state that the distal end portion of the cover tape and the temporary tape overlap each other; and
a heating member configured to heat-bond the cover tape and the temporary tape together by pinching a predetermined portion where the distal end portion of the cover tape and the temporary tape overlap each other, the heat-bonding being performed between the tape support member and the heating member; and
wherein the tape support member and the heating member have respective shapes for pinching the predetermined portion in such a state of the predetermined portion being bent at a halfway position along a length in a tape's longitudinal direction.

2. The tape auto-loading device according to claim 1, wherein the heating member has, as the shape, one of an angularly projecting shape in which two faces are formed across a ridge bend corner section defined therebetween and an angularly recessed shape in which two faces are formed across a root bend corner section defined therebetween, the angularly projecting shape and the angularly recessed shape corresponding to each other, wherein
the tape support member has, as the shape, the other of the angularly projecting shape and the angularly recessed shape, and
wherein the tape support member and the heating member execute heat-bonding so that a fold is formed in a halfway position in a tape's longitudinal direction of a bonding portion of the temporary tape to the cover tape.

3. The tape auto-loading device according to claim 2, wherein the tape support member and the heating member are moved relatively in a direction which bisects an angle formed by the two faces at the ridge bend corner section and an angle formed by the two faces at the root bend corner section in executing heat-bonding of the cover tape and the temporary tape together.

4. The tape auto-loading device according to claim 1, wherein the predetermined portion extends into a straight line over a whole region in the tape's longitudinal direction when the transfer devices pull the cover tape rearwards after gripping by the cover tape gripping device is cancelled for release.

5. A tape linking method for a tape auto-loading device for loading a carrier tape in a tape feeder in which a cover tape is peeled off from a base tape of the carrier tape and the cover tape so peeled off is discharged therefrom along a predetermined path, the tape linking method being configured to link a temporary tape laid along a path following the predetermined path and held in position by a temporary tape laying device to a distal end side of the cover tape gripped by a cover tape gripping device,
wherein the cover tape and the temporary tape are heat-bonded together by pinching a predetermined portion, where the distal end portion of the cover tape and the temporary tape overlap each other, between a tape support member and a heating member in such a state that the predetermined portion is bent at a halfway position along a length thereof in a tape's longitudinal direction.

* * * * *